(12) United States Patent
Jo

(10) Patent No.: US 12,156,440 B2
(45) Date of Patent: Nov. 26, 2024

(54) DISPLAY DEVICE

(71) Applicant: Samsung Display Co., LTD., Yongin-si (KR)

(72) Inventor: Yong Seon Jo, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 459 days.

(21) Appl. No.: 17/463,785

(22) Filed: Sep. 1, 2021

(65) Prior Publication Data

US 2022/0216280 A1 Jul. 7, 2022

(30) Foreign Application Priority Data

Jan. 4, 2021 (KR) ........................ 10-2021-0000425

(51) Int. Cl.
*H10K 59/124* (2023.01)
*H10K 59/12* (2023.01)
*H10K 59/131* (2023.01)
*H10K 71/00* (2023.01)

(52) U.S. Cl.
CPC ......... *H10K 59/124* (2023.02); *H10K 59/131* (2023.02); *H10K 71/00* (2023.02); *H10K 59/1201* (2023.02)

(58) Field of Classification Search
None
See application file for complete search history.

(56) References Cited

U.S. PATENT DOCUMENTS 9,589,991 B2 3/2017 Wang et al.
2016/0254287 A1* 9/2016 Wang ................. H01L 27/1244
257/40
2018/0374909 A1 12/2018 Nishikiori et al.
2019/0140202 A1 5/2019 Jin et al.
2020/0303479 A1* 9/2020 Kim .................... H01L 27/1248
(Continued)

FOREIGN PATENT DOCUMENTS

KR 101804359 B1 12/2017
KR 1020190068814 A 6/2019
(Continued)

OTHER PUBLICATIONS

Zhenghao Gan et al., "Material Structure and Mechanical Properties of Silicon Nitride and Silicon Oxynitride Thin Films Deposited by Plasma Enhanced Chemical Vapor Deposition," Surfaces, 2018, pp. 59-72.

*Primary Examiner* — Bo B Jang
(74) *Attorney, Agent, or Firm* — CANTOR COLBURN LLP

(57) ABSTRACT

A display device includes: a substrate; a semiconductor disposed on the substrate; a first gate insulating layer disposed on the semiconductor; a gate electrode disposed on the first gate insulating layer; a second gate insulating layer disposed on the gate electrode; a first storage electrode disposed on the second gate insulating layer; a first interlayer insulating layer disposed on the first storage electrode, where an opening is defined through the first interlayer insulating layer to surround the semiconductor, the gate electrode and the first storage electrode; and a second interlayer insulating layer disposed on the first interlayer insulating layer and disposed in the opening, where the second interlayer insulating layer includes an organic material.

20 Claims, 25 Drawing Sheets

(56) References Cited

U.S. PATENT DOCUMENTS

| | | | | |
|---|---|---|---|---|
| 2020/0343312 A1* | 10/2020 | Ryu | ..................... | G09G 3/3266 |
| 2022/0238623 A1* | 7/2022 | Choi | ..................... | H10K 59/124 |
| 2022/0310671 A1* | 9/2022 | Choi | ..................... | H10K 59/131 |

FOREIGN PATENT DOCUMENTS

| | | | |
|---|---|---|---|
| KR | 1020190091395 A | | 8/2019 |
| KR | 1020200035252 A | | 4/2020 |

* cited by examiner

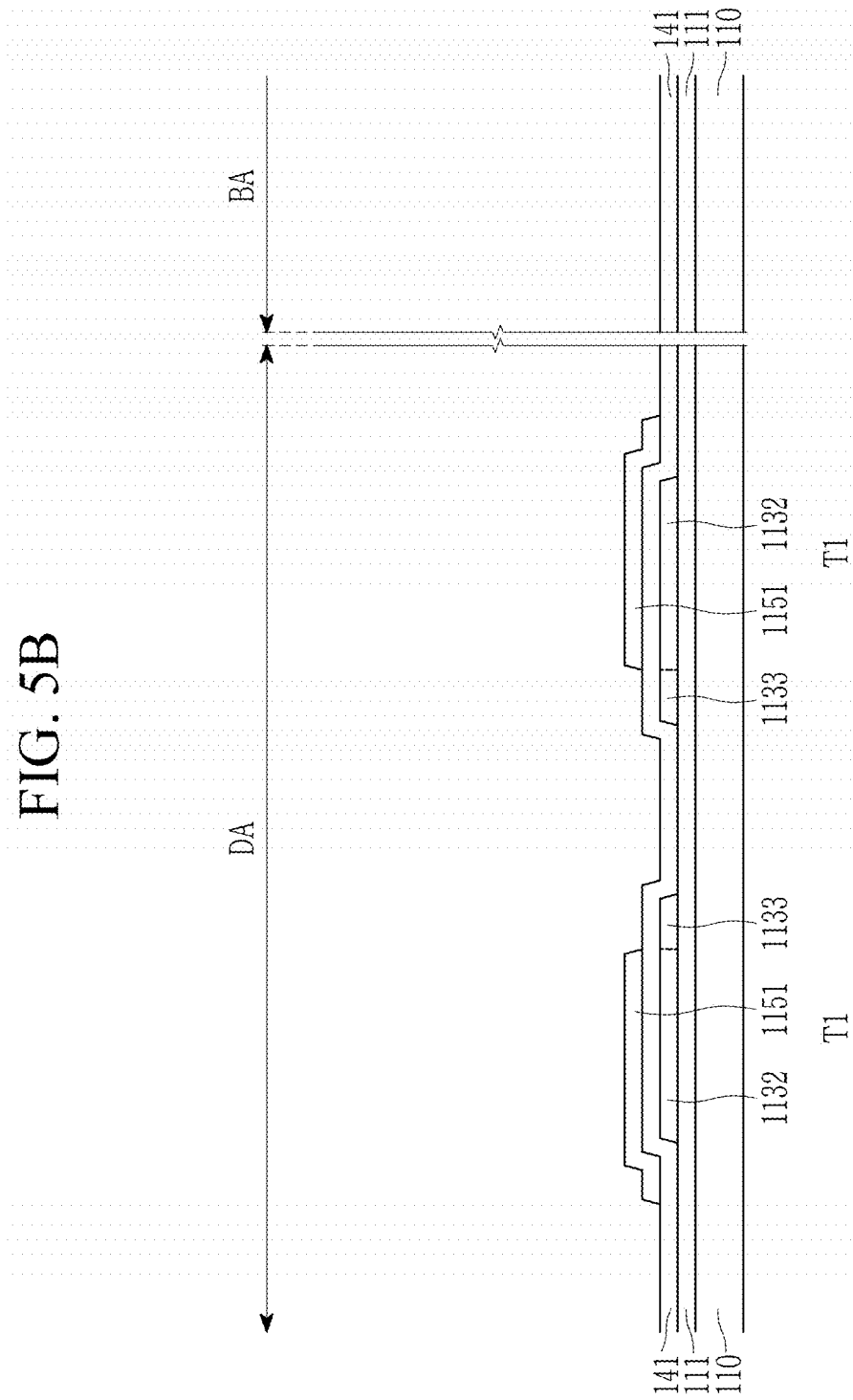

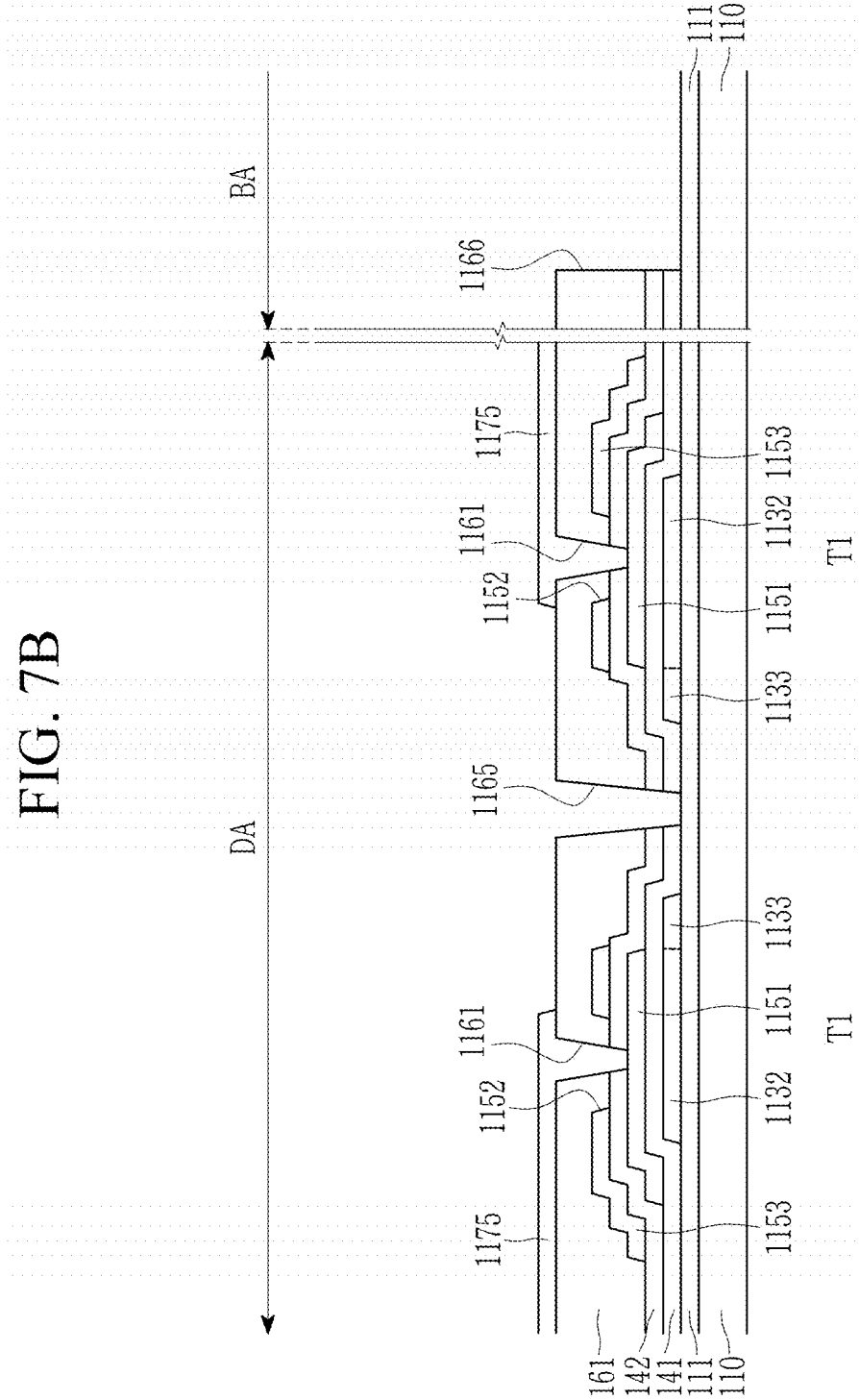

DISPLAY DEVICE

This application claims priority to Korean Patent Application No. 10-2021-0000425, filed on Jan. 4, 2021, and all the benefits accruing therefrom under 35 U.S.C. § 119, the content of which in its entirety is herein incorporated by reference.

BACKGROUND

1. Field

The disclosure relates to a display device.

2. Description of the Related Art

A display device serves to display an image on a device, and may include a liquid crystal display, an organic light emitting diode display, and the like. Such a display device is used in various electronic devices such as mobile phones, navigation units, digital cameras, electronic books, portable game machines, and various terminals.

An organic light emitting diode display may include two electrodes and an organic light emitting layer positioned therebetween, and electrons injected from one of the two electrodes and holes injected from the other electrode are combined in the organic light emitting layer to form excitons. Excitons output energy and emit light while changing from an excited state to a ground state.

The organic light emitting diode display typically includes a plurality of pixels including an organic light emitting diode that is a self-emission element, and a plurality of transistors and one or more capacitors are provided in each pixel to drive the organic light emitting diode.

SUMMARY

In a display device, a plurality of conductive layers and a plurality of insulating layers may be disposed or formed to form a transistor and a capacitor of each pixel, and when an impact is applied to the display device from an outside, a conductive layer or an insulating layer may be damaged, such that the display device may not operate properly. In addition, damage generated in some areas of the conductive layer or the insulating layer may propagate in a horizontal direction or a vertical direction, thereby affecting other layers.

Embodiments provide a display device in which an effect of external impact is reduced.

An embodiment provides a display device including: a substrate; a semiconductor disposed on the substrate; a first gate insulating layer disposed on the semiconductor; a gate electrode disposed on the first gate insulating layer; a second gate insulating layer disposed on the gate electrode; a first storage electrode disposed on the second gate insulating layer; a first interlayer insulating layer disposed on the first storage electrode, where an opening is defined through the first interlayer insulating layer to surround the semiconductor, the gate electrode and the first storage electrode; and a second interlayer insulating layer disposed on the first interlayer insulating layer and disposed in the opening, where the second interlayer insulating layer includes an organic material.

In an embodiment, the first interlayer insulating layer may include a plurality of layers having different characteristics from each other.

In an embodiment, a layer including a first material and a layer including a second material may be alternately and repeatedly stacked one on another in the first interlayer insulating layer.

In an embodiment, the first material may be a silicon oxide, and the second material may be a silicon nitride.

In an embodiment, the first interlayer insulating layer may include 10 or more layers.

In an embodiment, the first interlayer insulating layer may include an inorganic material.

In an embodiment, a thickness of the first interlayer insulating layer may be greater than or equal to about 4500 angstrom (Å) and less than or equal to about 5500 Å.

In an embodiment, the display device may include a plurality of pixel circuit regions, and the semiconductor, the gate electrode and the first storage electrode may be disposed in the pixel circuit regions.

In an embodiment, the opening may surround an edge of the pixel circuit regions, and the pixel circuit regions may be divided one from another by the opening.

According to an embodiment, the display device may further include: a plurality of transistors disposed on the substrate; and a lower first scan line, a lower second scan line and a lower emission control line, which are connected to at least one of the transistors, and the transistors, the lower first scan line, the lower second scan line and the lower emission control line may be disposed in the pixel circuit regions.

In an embodiment, lower first scan lines disposed in different pixel circuit regions may be spaced apart from each other, lower second scan lines disposed in different pixel circuit regions may be spaced apart from each other, and lower emission control lines disposed in different pixel circuit regions may be spaced apart from each other.

According to an embodiment, the display device may further include an upper first scan line, an upper second scan line and an upper emission control line, which are disposed on the second interlayer insulating layer, and the upper first scan line may be connected to the lower first scan lines disposed in the different pixel circuit regions, the upper second scan line may be connected to the lower second scan lines disposed in the different pixel circuit regions, and the upper emission control line may be connected to the lower emission control lines disposed in the different pixel circuit regions.

According to an embodiment, the display device may further include: a third interlayer insulating layer disposed on the upper first scan line, the upper second scan line, and the upper emission control line; a data line and a driving voltage line disposed on the third interlayer insulating layer to be connected to at least one of the transistors; a passivation layer disposed on the data line and the driving voltage line; an anode disposed on the passivation layer to be connected to at least one of the transistors; a light emitting diode layer disposed on the anode; and a cathode disposed on the light emitting diode layer.

In an embodiment, each of the first gate insulating layer and the second gate insulating layer may include an inorganic material, and the opening may be defined further through the first gate insulating layer and the second gate insulating layer.

An embodiment provides a display device including: a substrate; a semiconductor disposed on the substrate; a first gate insulating layer disposed on the semiconductor; a gate electrode disposed on the first gate insulating layer; a second gate insulating layer disposed on the gate electrode; a first storage electrode disposed on the second gate insulating layer; and a first interlayer insulating layer disposed on the first storage electrode, where a layer including a first material and a layer including a second material are alternately and repeatedly stacked one on another in the first interlayer insulating layer, and the first material and the second material have different characteristics from each other.

In an embodiment, the first material may be a silicon oxide, and the second material may be a silicon nitride.

In an embodiment, the first interlayer insulating layer may include 10 or more layers.

In an embodiment, a thickness of the first interlayer insulating layer may be greater than or equal to about 4500 Å and less than or equal to about 5500 Å.

According to an embodiment, the display device may further include a second interlayer insulating layer disposed on the first interlayer insulating layer, and an opening may be defined through the first gate insulating layer, the second gate insulating layer and the first interlayer insulating layer to surround the semiconductor, the gate electrode, and the first storage electrode, the second interlayer insulating layer may be disposed to fill the opening, the first interlayer insulating layer may include an inorganic material, and the second interlayer insulating layer includes an organic material.

In an embodiment, the display device may include a plurality of pixel circuit regions, the semiconductor, the gate electrode, and the first storage electrode may be disposed in the pixel circuit regions, and the opening surround an edge of the pixel circuit regions, while the pixel circuit regions may be divided one from another by the opening.

According to embodiments of the invention, as described herein, damage in some areas thereof due to external impact may be effectively prevented from propagating to other areas.

BRIEF DESCRIPTION OF THE DRAWINGS

FIG. 4B, FIG. 5B, FIG. 6B, FIG. 7B, FIG. 8B, and FIG. 9B illustrate cross-sectional views sequentially showing a manufacturing sequence of a display device according to an embodiment.

DETAILED DESCRIPTION

Figure 1:
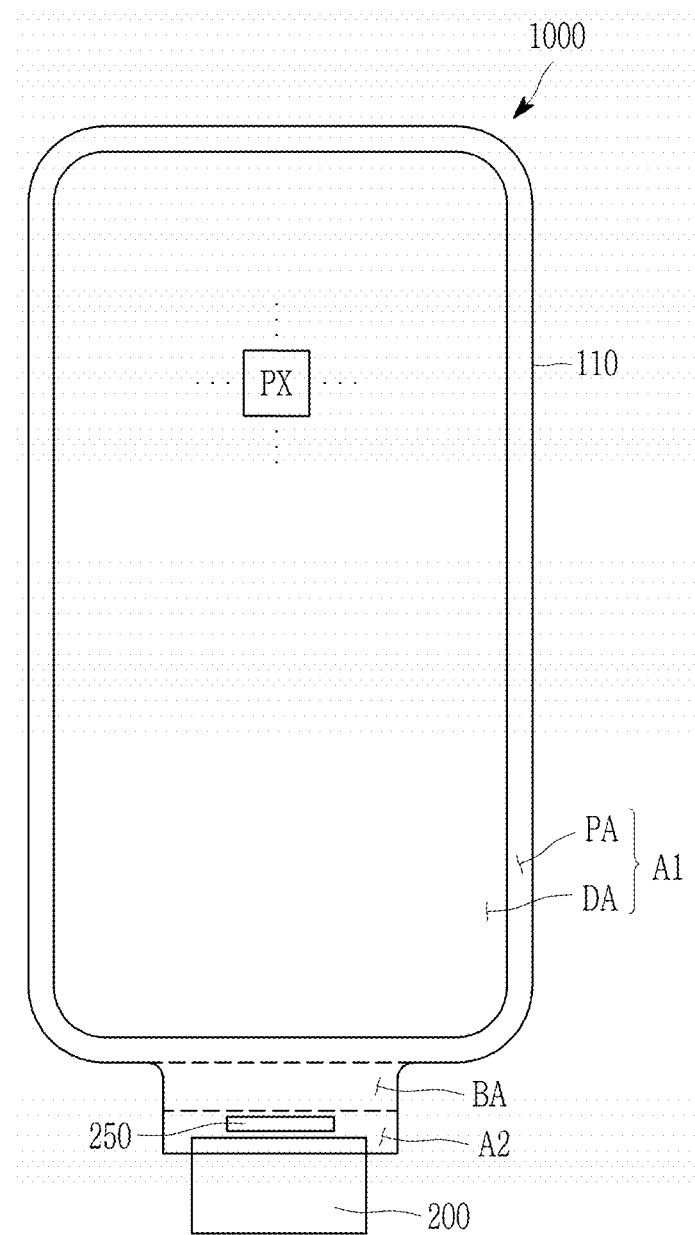
FIG. 1 illustrates a top plan view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Further, since sizes and thicknesses of constituent members shown in the accompanying drawings are arbitrarily given for better understanding and ease of description, the invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below Further, herein, the phrase "in a plan view" means when an object portion is viewed from above, and the phrase "in a cross-sectional view" means when a cross-section taken by vertically cutting an object portion is viewed from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

A display device according to an embodiment will be described with reference to FIG. 1.

FIG. 1 illustrates a top plan view of a display device according to an embodiment.

As illustrated in FIG. 1, an embodiment of the display device 1000 includes a substrate 110 and a plurality of pixels PX disposed or positioned on the substrate 110.

The substrate 110 includes a first area A1, a second area A2, and a bending area BA positioned between the first area A1 and the second area A2. The substrate 110 may include or be made of a flexible material, and may be changed in various forms. In such an embodiment, the substrate 110 may be flexible, stretchable, foldable, bendable, or rollable. The bending area BA may be an area where the substrate 110 is bendable. The first area A1 and the second area A2 may have a flat shape. In one embodiment, the substrate may include only a single bending area BA as shown in FIG. 1, but not being limited thereto. Alternatively, the substrate 110 may additionally include an area to be bendable. In one embodiment, for example, at least a portion of the first area A1 or the second area A2 of the substrate 110 may be bendable.

The first area A1 of the substrate 110 extends from the bending area BA. The first area A1 may be in a substantially rectangular shape including a long side and a short side, and may have a shape having a curved area by chamfering a corner portion as shown in FIG. 1, but not being limited thereto. Alternatively, the shape of the first area A1 may be modified into one of other various shapes. The first area A1 may include a display area DA and a peripheral area PA. The display area DA may be positioned in a central portion of the first area A1, and may have a shape that is substantially similar to that of the first area A1. The periphery area PA may surround the display area DA. In such an embodiment, the peripheral area PA may be positioned in an outer portion of the first area A1.

The pixels PX may be disposed or positioned in the display area DA. The pixels PX may be arranged in a matrix form to receive an image signal and accordingly display an image. In such an embodiment, an arrangement shape of the pixels PX may be variously changed or modified. Although not illustrated, an embodiment of the display device may further include a plurality of signal lines. The signal lines may include a plurality of scan lines, a plurality of emission control lines, a plurality of data lines, a plurality of driving voltage lines, and the like. Each of the signal lines may transmit a scan signal, a light emission control signal, a data signal, a driving voltage, or the like. The signal lines may be positioned to cross each other in a row direction or a column direction. In an embodiment, each pixel PX may include a plurality of transistors, capacitors, and at least one light emitting diode connected to a plurality of signal lines. In such an embodiment, the display device may be an organic light emitting diode display. However, a type of the display device is not limited thereto, and the display device may be one of other various types of display devices. In one embodiment, for example, the display device may be a liquid crystal display, an electrophoretic display, an electrowetting display device, or the like.

The second area A2 of the substrate 110 extends from the bending area BA. The second area A2, which is a non-display area that does not display an image, does not include the pixel PX. Elements and/or wires for generating and/or transferring various signals applied to the pixels PX are positioned in the second area A2.

In an embodiment, a driving circuit chip 250 and a flexible circuit board 200 may be disposed or positioned on the second area A2. The driving circuit chip 250 is connected to the elements or the wires located in the second area A2 to transfer various signals to the pixels PX. In one embodiment, for example, the driving circuit chip 250 may supply a scan signal, a control signal, and a data signal. The flexible circuit board 200 may be attached to an edge of the second area A2 of the substrate 110. The flexible circuit board 200 may include or be made of a flexible material. A circuit for controlling driving of a display device is designed or provided in the flexible circuit board 200.

The bending area BA of the substrate 110 is positioned between the first area A1 and the second area A2 to connect the first area A1 and the second area A2. When the substrate 110 is bent, the first area A1 and the second area A2 may be disposed to overlap each other. The bending area BA of the substrate 110 may be positioned to be connected to a short side of the first area A1. However, such a position of the bending area BA is not limited thereto, and may be variously changed. In one alternative embodiment, for example, the bending area BA may be positioned to be connected to opposite short sides of the first area A1, or may be positioned to be connected to the long sides.

Hereinafter, one pixel of the display device according to an embodiment will be described with reference to FIG. 2.

Figure 2:
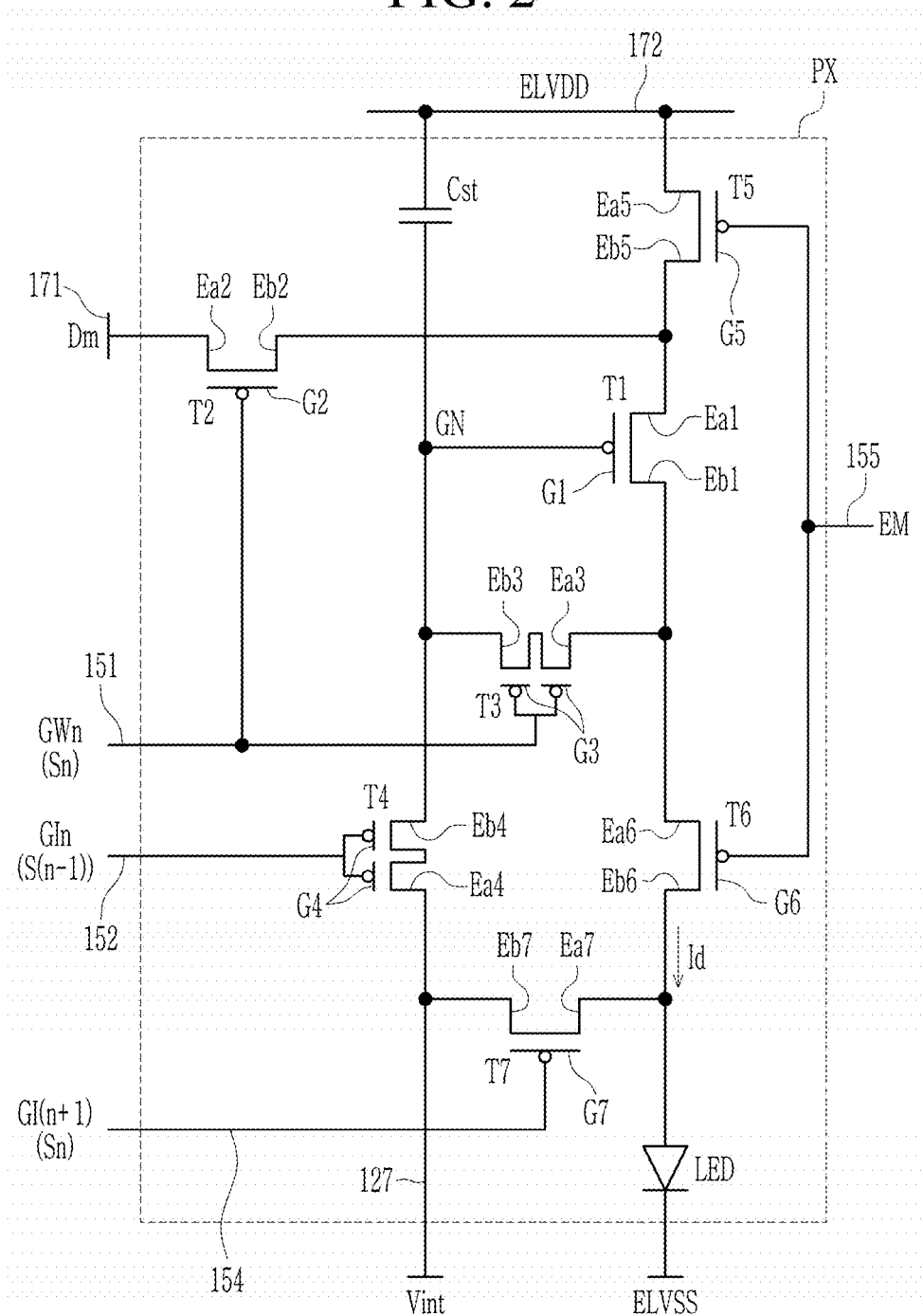
FIG. 2 illustrates a circuit diagram of a pixel of a display device according to an embodiment.

FIG. 2 illustrates a circuit diagram of a pixel of a display device according to an embodiment.

In an embodiment, as illustrated in FIG. 2, the display device includes a plurality of pixels PX displaying an image, and a plurality of signal lines 127, 151, 152, 153, 154, 171, and 172. One pixel PX may include a plurality of transistors T1, T2, T3, T4, T5, T6, and T7, a capacitor Cst, and at least one light emitting diode LED connected to the signal lines 127, 151, 152, 153, 154, 171, and 172. Hereinafter, for convenience of description, an embodiment in which one pixel PX includes a single light emitting diode LED as shown in FIG. 2 will be mainly described, but not being limited thereto.

In such an embodiment, the signal lines 127, 151, 152, 154, 155, 171, and 172 may include an initialization voltage line 127, a plurality of scan lines 151, 152, and 154, an emission control line 155, a data line 171, and a driving voltage line 172.

The initialization voltage line 127 may transfer an initialization voltage Vint. The scan lines 151, 152, and 154 may transfer scan signals GWn, GIn, and GI(n+1), respectively. The scan signals GWn, GIn, and GI(n+1) may transfer a gate-on voltage and a gate-off voltage that can turn the transistors T2, T3, T4, and T7 included in the pixel PX on or off.

The scan lines 151, 152, and 154 connected to the pixel PX may include a first scan line 151 through which the scan signal GWn may be transferred, a second scan line 152 through which the scan signal GIn having a gate-on voltage may be transferred at a different time from that of the first scan line 151, and a third scan line 154 through which the scan signal GI(n+1) may be transferred. Hereinafter, an embodiment in which the second scan line 152 transfers the gate-on voltage at a time that is earlier than that of the first scan line 151 will be mainly described for convenience of description. In one embodiment, for example, when the scan signal GWn is an $n^{th}$ scan signal Sn (here, n is a natural number that is equal to or greater than 1) among the scan signals applied during one frame, the scan signal GIn may be a previous-stage scan signal such as an (n−1)th scan signal S(n−1), and the scan signal GI(n+1) may be an $n^{th}$ scan signal Sn. However, the embodiment is not limited thereto, and the scan signal GI(n+1) may be a scan signal that is different from the $n^{th}$ scan signal Sn.

The emission control line 155 may transfer a control signal, or an emission control signal EM capable of controlling emission of a light emitting diode LED included in the pixel PX. The control signal transferred by the emission control line 155 may transfer the gate-on voltage and the gate-off voltage, and may have a waveform that is different from that of the scan signal transferred by the scan lines 151, 152, and 154.

The data line 171 may transfer a data signal Dm, and the driving voltage line 172 may transfer a driving voltage ELVDD. The data signal Dm may have a different voltage level depending on an image signal inputted into the display device, and the driving voltage ELVDD may have a substantially constant level.

Although not illustrated, the display device may further include a driver that transfer signals to the signal lines 127, 151, 152, 153, 154, 171, and 172.

The transistors T1, T2, T3, T4, T5, T6, and T7 included in one pixel PX may include a first transistor T1, a second transistor T2, a third transistor T3, a fourth transistor T4, a fifth transistor T5, a sixth transistor T6, and a seventh transistor T7.

The first scan line 151 may transfer the scan signal GWn to the second transistor T2 and the third transistor T3, the second scan line 152 may transfer a scan signal GIn to the fourth transistor T4, the third scan line 154 may transfer a scan signal GI(n+1) to the seventh transistor T7, and the control line 155 may transfer an emission control signal EM to the fifth transistor T5 and the sixth transistor T6.

The gate electrode G1 of the first transistor T1 is connected to a first end of the capacitor Cst through a driving gate node GN, a first electrode Ea1 of the first transistor T1 is connected to the driving voltage line 172 via the fifth transistor T5, and a second electrode Eb1 of the first transistor T1 is connected to an anode of the light emitting diode LED via the sixth transistor T6. The first transistor T1 may receive a data signal Dm transferred by the data line 171 based on a switching operation of the second transistor T2 to supply a driving current Id to the light emitting diode LED.

The gate electrode G2 of the second transistor T2 is connected to the first scan line 151, a first electrode Ea2 of the second transistor T2 is connected to the data line 171, and a second electrode Eb2 of the second transistor T2 is connected to the first electrode Ea11 of the first transistor T1 and to the driving voltage line 172 via the fifth transistor T5. The second transistor T2 may be turned on based on the scan signal GWn received through the first scan line 151 to transfer the data signal Dm transferred from the data line 171 to the first electrode Ea1 of the first transistor T1.

A gate electrode G3 of the third transistor T3 is connected to the first scan line 151, and a first electrode Ea3 of the third transistor T3 is connected to the second electrode Eb1 of the first transistor T1 and to the anode of the light emitting diode LED via the sixth transistor T6. A second electrode Eb3 of the third transistor T3 is connected to a second electrode Eb4 of the fourth transistor T4, the first end of the capacitor Cst, and the gate electrode G1 of the first transistor T1. The third transistor T3 may be turned on based on the scan signal GWn transferred through the first scan line 151 to connect the gate electrode G1 and the second electrode Eb1 of the first transistor T1 to each other such that the first transistor T1 may be diode-connected.

The gate electrode G4 of the fourth transistor T4 is connected to the second scan line 152, a first electrode Ea4 of the fourth transistor T4 is connected to a terminal of an initialization voltage Vint, and a second electrode Eb4 of the fourth transistor T4 is connected to a first end of the capacitor Cst via the second electrode Eb3 of the third transistor T3 and to the gate electrode G1 of first transistor T1. The fourth transistor T4 is turned on by the scan signal GIn transferred through the second scan line 152 to transfer the initialization voltage Vint to the gate electrode G1 of the first transistor T1, to perform an initializing operation for initializing a voltage of the gate electrode G1 of the transistor T1.

The gate electrode G5 of the fifth transistor T5 is connected to the emission control line 155, a first electrode Ea5 of the fifth transistor T5 is connected to the driving voltage line 172, and a second electrode Eb5 of the fifth transistor T5 is connected to the first electrode Ea1 of the first transistor T1 and to the second electrode Eb2 of the second transistor T2.

A gate electrode G6 of the sixth transistor T6 is connected to the emission control line 155, and a first electrode Ea6 of the sixth transistor T6 is connected to the first electrode Eb1 of the first transistor T1 and the first electrode Ea3 of the third transistor T3. A second electrode Eb6 of the sixth transistor T6 is electrically connected to the anode of the light emitting diode LED. The fifth transistor T5 and the sixth transistor T6 are simultaneously turned on based on the emission control signal EM transferred through the emission control line 155, thereby the driving voltage ELVDD is compensated through the diode-connected first transistor T1 to be transmitted to the light emitting diode LED.

A gate electrode G7 of the seventh transistor T7 is connected to the third scan line 154, and a first electrode Ea7 of the seventh transistor T7 is connected to the second electrode Eb6 of the sixth transistor T6 and the anode of the light emitting diode LED. A second electrode Eb7 of the seventh transistor T7 is connected to the terminal of the initialization voltage Vint terminal and the first electrode Ea4 of the fourth transistor T4.

The transistors T1, T2, T3, T4, T5, T6, and T7 may be P-type channel transistors such as P-channel metal-oxide-semiconductor ("PMOS") transistors, but the invention is not limited thereto, and at least one of the transistors T1, T2, T3, T4, T5, T6, and T7 may be an N-type channel transistor, or may include both a P-type channel transistor and an N-type channel transistor.

A first end of the capacitor Cst is connected to the gate electrode G1 of the first transistor T1 as described above, and a second end of the capacitor Cst is connected to the driving voltage line 172. A cathode of the light emitting diode LED may be connected to the terminal of the common voltage ELVSS for transferring the common voltage ELVSS to receive the common voltage ELVSS.

The structure of a pixel PX according to an embodiment is not limited to the structure illustrated in FIG. 2, and numbers of the transistors and capacitors included in one pixel PX and a connection relationship thereof may be variously modified.

Hereinafter, an interlayer structure of one pixel of the display device according to an embodiment will be further described with reference to FIG. 3A to FIG. 9B.

Figure 3A:
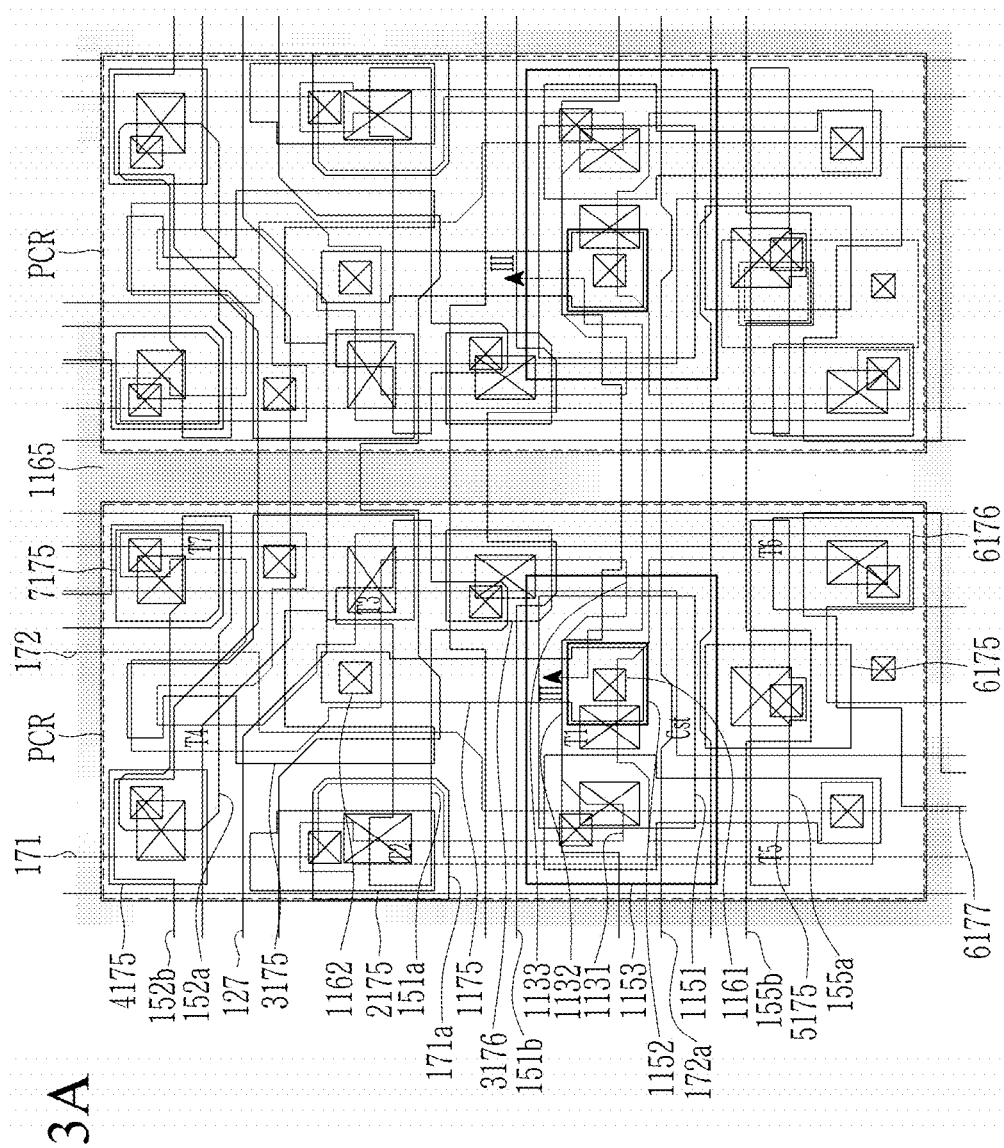
FIG. 3A partially illustrates a top plan view of a display device according to an embodiment.
Figure 3B:
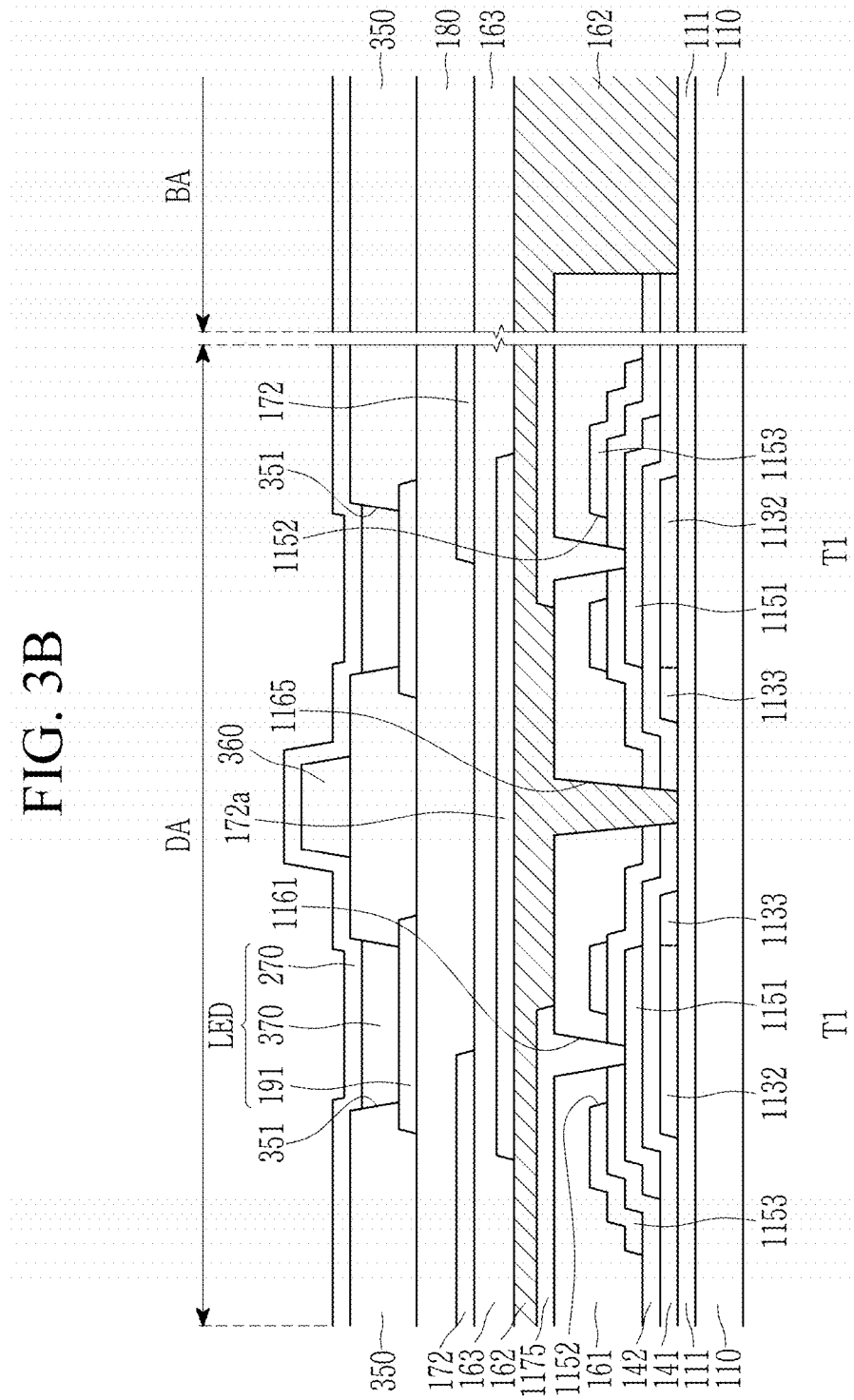
FIG. 3B partially illustrates a cross-sectional view of a display device according to an embodiment.

FIG. 3A partially illustrates a top plan view of a display device according to an embodiment, and FIG. 3B partially illustrates a cross-sectional view of a display device according to an embodiment. FIG. 3B illustrates a portion of the display area taken along line III-III of FIG. 3A, and illustrates a portion of the bending area. FIG. 4A, FIG. 5A, FIG. 6A, FIG. 7A, FIG. 8A, and FIG. 9A illustrate top plan views sequentially showing a manufacturing sequence of a display device according to an embodiment. FIG. 4B, FIG. 5B, FIG. 6B, FIG. 7B, FIG. 8B, and FIG. 9B illustrate cross-sectional views sequentially showing a manufacturing sequence of a display device according to an embodiment. FIG. 3A to FIG. 9B illustrate two adjacent pixels, and the two adjacent pixels may have planar structures that are symmetrical to each other. However, the invention is not limited thereto, and the two adjacent pixels may have a same planar structure as each other.

Figure 4A:
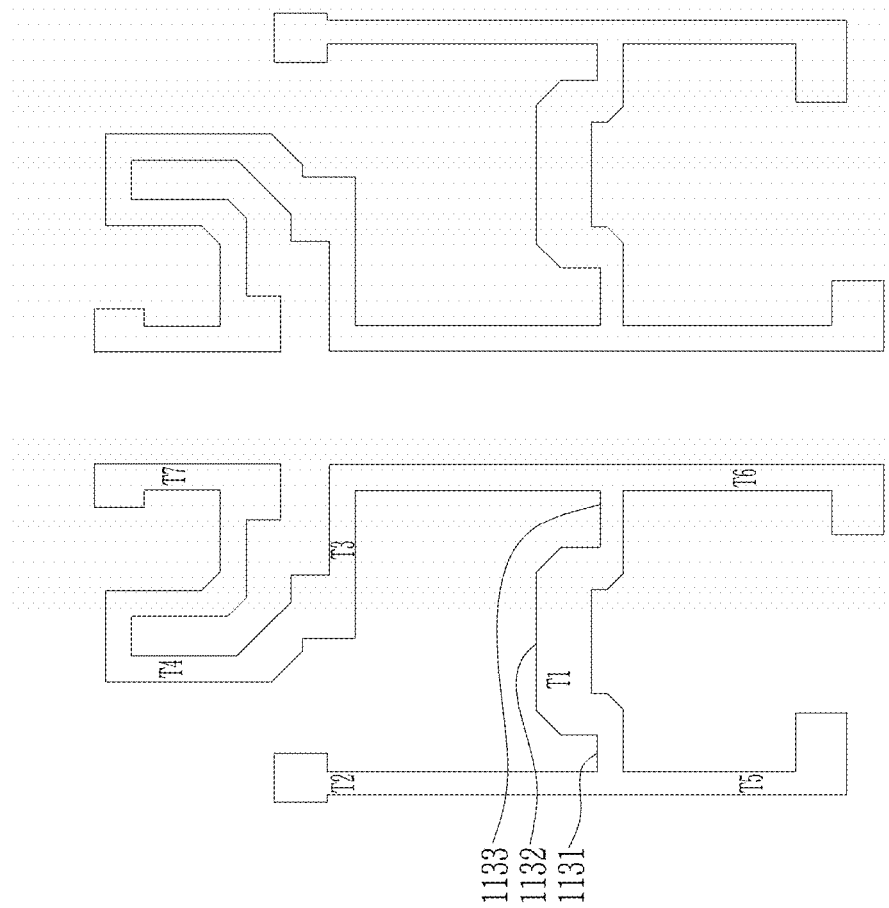
FIG. 4A, FIG. 5A, FIG. 6A, FIG. 7A, FIG. 8A, and FIG. 9A illustrate top plan views sequentially showing a manufacturing sequence of a display device according to an embodiment.
Figure 4B:
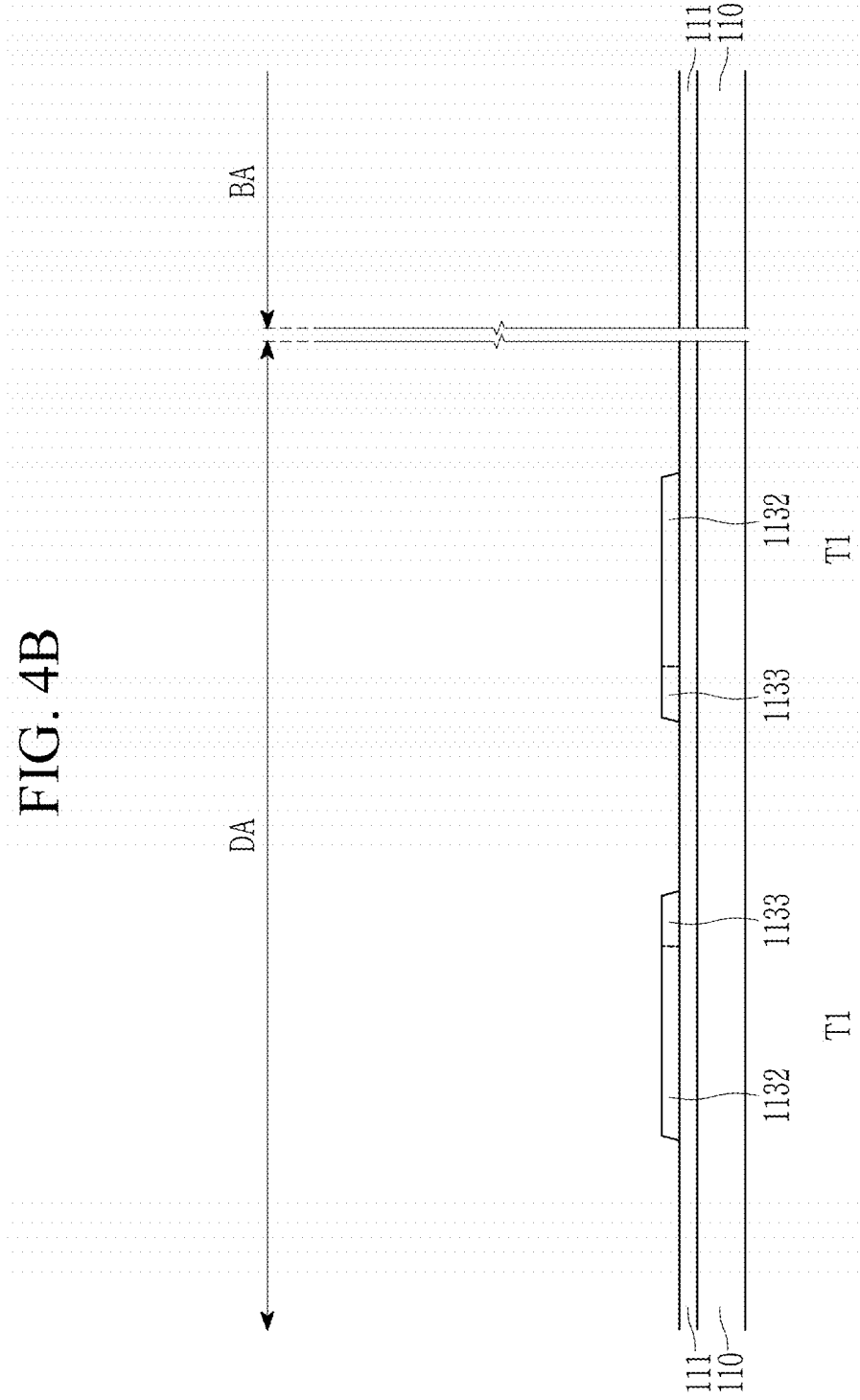

In an embodiment, a semiconductor layer including a channel 1132, a first region 1131, and a second region 1133 of the first transistor T1 may be positioned or disposed on the substrate 110. FIG. 4A and FIG. 4B show a semiconductor layer. The semiconductor layer 130 may further include a channel, a first region, and a second region of each of the second transistor T2, the third transistor T3, the fourth transistor T4, the fifth transistor T5, the sixth transistor T6, and the seventh transistor T7 as well as the first transistor T1.

The channel 1132 of the first transistor T1 may have a bent shape in a plan view. However, the shape of the channel 1132 of the first transistor T1 is not limited thereto, and may be variously changed. In one embodiment, for example, the channel 1132 of the first transistor T1 may be bent in a different shape, or may be formed in a bar-like shape. The first region 1131 and the second region 1133 of the first transistor T1 may be positioned at opposite sides of the channel 1132 of the first transistor T1. The first region 1131 of the first transistor T1 extends upward and downward in a plan view, a portion extending downward may be connected to the second region of the fifth transistor T5, and a portion extending upward may be connected to the second region of the second transistor T2. The second region 1133 of the first transistor T1 extends upward and downward in a plan view, a portion extending downward may be connected to the first region of the sixth transistor T6, and a portion extending upward may be connected to the first region of the third transistor T3.

In an embodiment, as shown in FIGS. 3B and 4B, a buffer layer 111 may be disposed between the substrate 110 and the semiconductor layer including the channel 1132, the first region 1131, and the second region 1133 of the first transistor T1. The buffer layer 111 may have a single or multi-layered structure.

The buffer layer 111 may include an inorganic insulating material or organic insulating material such as a silicon nitride ($SiN_x$), a silicon oxide ($SiO_x$), and a silicon oxynitride ($SiO_xN_y$). In an embodiment, a barrier layer may be further disposed between the substrate 110 and the buffer layer 111. The buffer layer may have a single or multi-layered structure. The barrier layer may include an inorganic insulating material such as a silicon nitride ($SiN_x$), a silicon oxide ($SiO_x$), and a silicon oxynitride ($SiO_xN_y$).

In an embodiment, as shown in FIG. 3B and FIG. 5B, a first gate insulating layer 141 may be disposed on the semiconductor layer including the channel 1132, the first region 1131, and the second region 1133 of the first transistor T1. The first gate insulating layer 141 may have a single or multi-layered structure. The first gate insulating layer 141 may include an inorganic insulating material such as a silicon nitride ($SiN_x$), a silicon oxide ($SiO_x$), and a silicon oxynitride ($SiO_xN_y$).

Figure 5A:
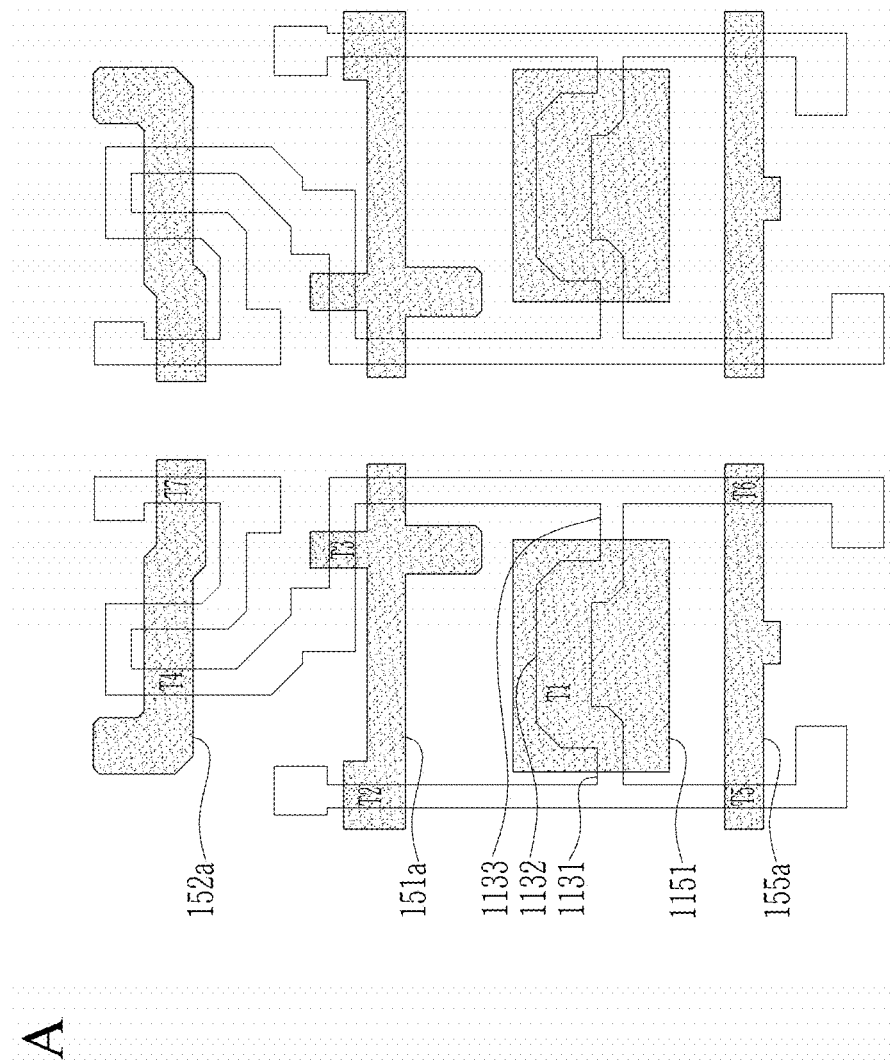

In such an embodiment, a first gate conductor including a gate electrode 1151 of the first transistor T1 may be disposed or positioned on the first gate insulating layer 141. FIG. 5A and FIG. 5B show a semiconductor layer and a first gate conductor together.

The first gate conductor may have a single or multi-layered structure. The first gate conductor may include a metal material such as molybdenum (Mo), aluminum (Al), copper (Cu), and/or titanium (Ti). The gate conductor may further include a gate electrode of each of the second transistor T2, the third transistor T3, the fourth transistor T4, the fifth transistor T5, the transistor T6, and the seventh transistor T7 as well as the first transistor T1.

In an embodiment, as shown in FIG. 5A, the gate electrode 1151 of the driving transistor T1 may overlap the channel 1132 of the driving transistor T1. The channel 1132 of the first transistor T1 may be covered by the gate electrode 1151 of the first transistor T1.

The first gate conductor may further include a lower first scan line 151a, a lower second scan line 152a, and a lower emission control line 155a. The lower first scan line 151a, the lower second scan line 152a, and the lower emission control line 155a may extend substantially in a row direction. The lower first scan line 151a, the lower second scan line 152a, and the lower emission control line 155a may be independently or separately positioned in two adjacent pixels. In such an embodiment, the lower first scan line 151a positioned in a left pixel may be positioned apart from the lower first scan line 151a positioned in a right pixel. In an embodiment, the lower second scan line 152a positioned in the left pixel may be positioned apart from the lower second scan line 152a positioned in the right pixel. In an embodiment, the lower emission control line 155a positioned in the left pixel may be positioned apart from the lower emission control line 155a positioned in the right pixel. The lower first scan line 151a may be connected to the gate electrode of the second transistor T2 and the gate electrode of the third transistor T3. The lower first scan line may be integrally formed with the gate electrode of the second transistor T2 and the gate electrode of the third transistor T3 as a single unitary unit. The lower second scan line 152a may be connected to the gate electrode of the fourth transistor T4. The lower second scan line 152a may be integrally formed with the gate electrode of the fourth transistor T4 as a single unitary unit. The lower second scan line 152a may be connected to the gate electrode of the seventh transistor T7 positioned in a pixel of a previous stage. In such an embodiment, the bypass control line connected to the seventh transistor T7 may be formed as the lower second scan line 152a of a next stage. The lower emission control line 155a may be connected to the gate electrode of the fifth transistor T5 and the gate electrode of the sixth transistor T6. The lower emission control line 155a may be integrally formed with the gate electrode of the fifth transistor T5 and the gate electrode of the sixth transistor T6 as a single unitary unit.

After the first gate conductor including the gate electrode 1151 of the first transistor T1 is provided or formed, a doping process or plasma treatment may be performed. A portion of the semiconductor layer covered by the first gate conductor is not subjected to doping or plasma treatment, and a portion of the semiconductor layer which is not covered by the first gate conductor may be doped or treated with plasma to have the same characteristic as that of the conductor. Accordingly, the first and second regions of the first to seventh transistors T1, T2, T3, T4, T5, T6, and T7 of the semiconductor layer may serve as a first electrode and a second electrode, respectively. In such an embodiment, the doping process may be performed with a p-type dopant, and the first transistor T1, the second transistor T2, the third transistor T3, the fourth transistor T4, the fifth transistor T5, the sixth transistor T6, and the seventh transistor T7 may have a p-type transistor characteristic.

Figure 6A:
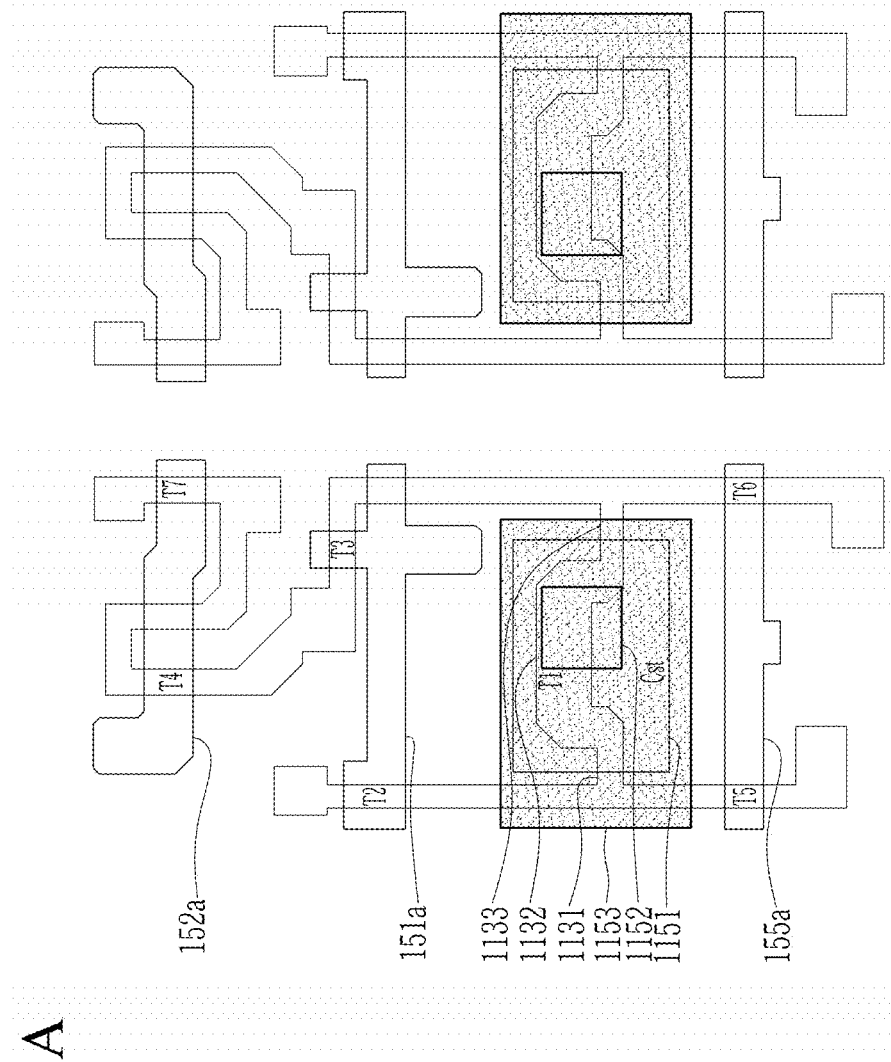
Figure 6B:
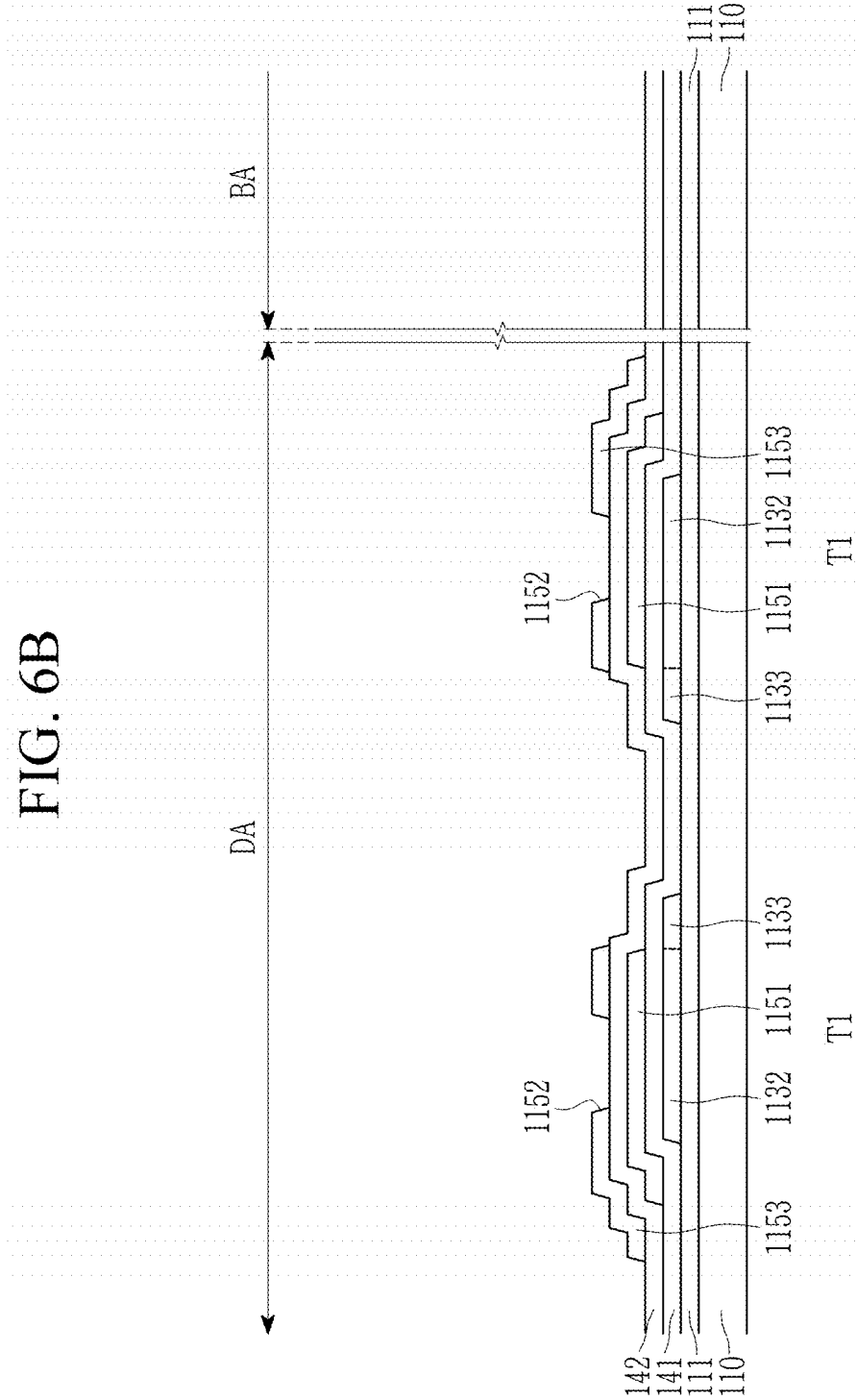

In an embodiment, as shown in FIGS. 3B and 6B, a second gate insulating layer 142 may be disposed on the first gate insulating layer 141 and the first gate conductor including the gate electrode 1151 of the first transistor T1. The second gate insulating layer 142 may have a single or multi-layered structure. The second gate insulating layer 142 may include an inorganic insulating material such as a silicon nitride ($SiN_x$), a silicon oxide ($SiO_x$), and a silicon oxynitride ($SiO_xN_y$).

A second gate conductor including the first storage electrode 1153 of the storage capacitor Cst may be disposed or positioned on the second gate insulating layer 142. FIG. 6A and FIG. 6B show a semiconductor layer, a first gate conductor, and a second gate conductor together. The second gate conductor may have a single or multi-layered structure. The second gate conductor may include a metal material such as molybdenum (Mo), aluminum (Al), copper (Cu), and/or titanium (Ti).

The first storage electrode 1153 overlaps the gate electrode 1151 of the first transistor T1 to constitute the storage capacitor Cst. An opening 1152 is defined or formed in the first storage electrode 1153 of the storage capacitor Cst. The opening 1152 of the first storage electrode 1153 of the storage capacitor Cst may overlap the gate electrode 1151 of the first transistor T1.

In an embodiment, as shown in FIG. 3B and FIG. 7B, a first interlayer insulating layer 161 may be disposed on the second gate conductor including the first storage electrode 1153 of the storage capacitor Cst. The first interlayer insulating layer 161 may have a single or multi-layered structure. The first interlayer insulating layer 161 may include an inorganic insulating material such as a silicon nitride ($SiN_x$), a silicon oxide ($SiO_x$), and a silicon oxynitride ($SiO_xN_y$). The first interlayer insulating layer 161 may be formed by alternately stacking layers of different materials from each other. In one embodiment, for example, 10 or more layers of a silicon nitride and a silicon oxide may be alternately stacked to form the first interlayer insulating layer 161. The multi-layered structure of the first interlayer insulating layer 161 will be described later in greater detail.

Figure 7A:
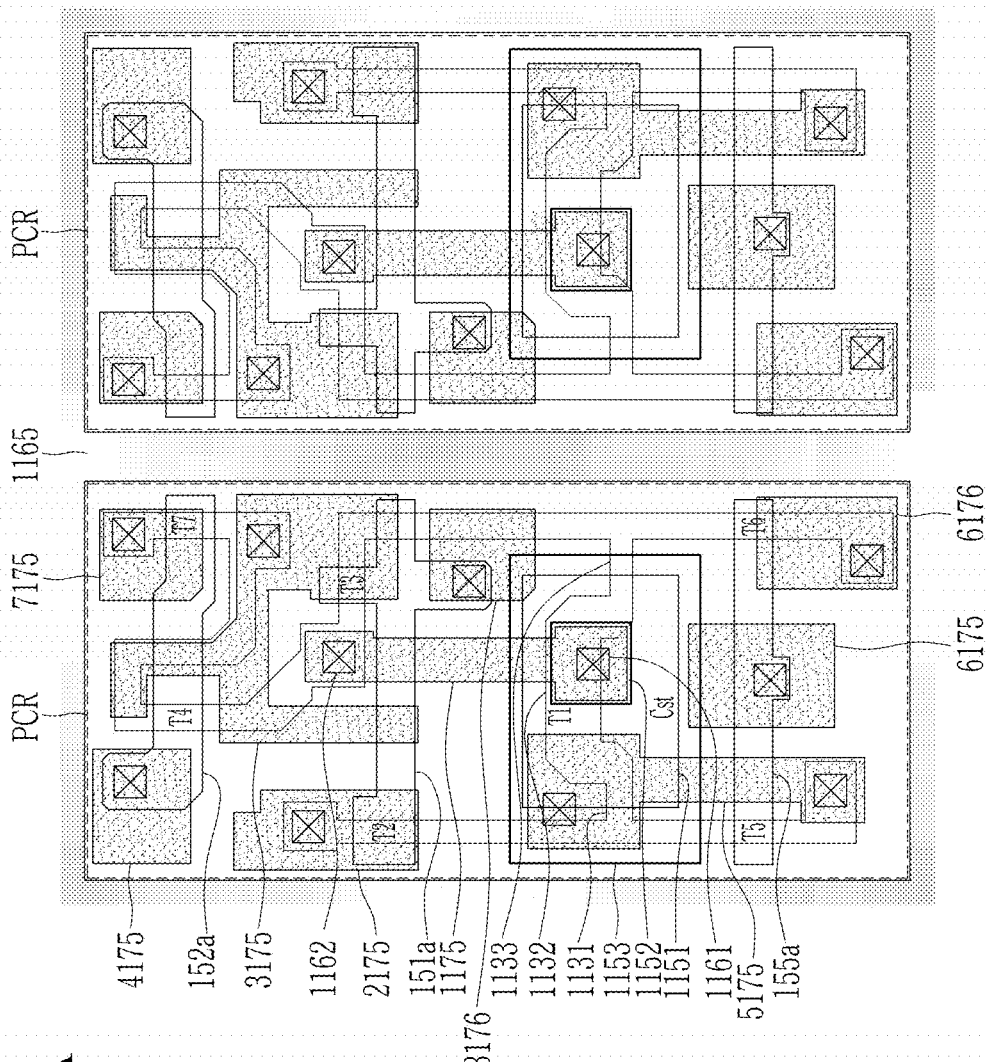

In such an embodiment, a third gate conductor including the first connection electrode 1175 may be disposed or positioned on the first interlayer insulating layer 161. FIG. 7A and FIG. 7B illustrate a semiconductor layer, a first gate conductor, a second gate conductor, and a third gate conductor together. The third gate conductor may have a single or multi-layered structure. The third gate conductor may include a metal material such as molybdenum (Mo), aluminum (Al), copper (Cu), and/or titanium (Ti).

The first connection electrode 1175 may connect the first transistor T1, the third transistor T3, and the fourth transistor T4. An end of a first side of the first connection electrode 1175 may overlap the gate electrode 1151 of the first transistor T1. An opening 1161 may be defined or formed through the first interlayer insulating layer 161 to overlap the first connection electrode 1175 and the gate electrode 1151 of the first transistor T1. The first connection electrode 1175 may be connected to the gate electrode 1151 of the first transistor T1 through the opening 1161 and the opening 1152 of the first storage electrode 1153. An end of a second side of the first connection electrode 1175 may overlap the second region of the third transistor T3 and the second region of the fourth transistor T4. In an embodiment, an opening 1162 may be defined or formed through the first interlayer insulating layer 161 to overlap the first connection electrode 1175, the second region of the third transistor T3, and the second region of the fourth transistor T4. The first connection electrode 1175 may be connected to the second region of the third transistor T3 and the second region of the fourth transistor T4 through the opening 1162. Accordingly, the gate electrode 1151 of the first transistor T1 may be connected to the second region of the third transistor T3 and the second region of the fourth transistor T4 by the first connection electrode 1175.

In an embodiment, as shown in FIG. 7A, the third gate conductor may further include a second connection electrode 2175, a third connection electrode 3175, a fourth connection electrode 3176, a fifth connection electrode 4175, a sixth connection electrode 5175, a seventh connection electrode 6175, an eighth connection electrode 6176, and a ninth connection electrode 7175.

The second connection electrode 2175 may overlap the second transistor T2, and may be connected to the first region of the second transistor T2. The third connection electrode 3175 may overlap the third transistor T3, the fourth transistor T4, and the seventh transistor T7, and may be connected to the first region of the fourth transistor T4 and the second region of the seventh transistor T7. The fourth connection electrode 3176 may overlap and may be connected to the lower first scan line 151*a*. The fifth connection electrode 4175 may overlap and may be connected to the lower second scan line 152*a*. The sixth connection electrode 5175 may overlap the first storage electrode 1153 and the fifth transistor T5, and may be connected to the first storage electrode 1153 and the first region of the fifth transistor T5. The seventh connection electrode 6175 may overlap and may be connected to the lower emission control line 155*a*. The eighth connection electrode 6176 may overlap the sixth transistor T6 and may be connected to the second region of the sixth transistor T6. The ninth connection electrode 7175 may overlap the seventh transistor T7, and may be connected to the first region of the seventh transistor T7.

In one pixel, the first to the seventh transistors T1, T2, T3, T4, T5, T6, and T7, the storage capacitor Cst, the lower first scan line 151*a*, the lower second scan line 152*a*, the lower emission control line 155*a*, the first connection electrode 1175, the second connection electrode 2175, the third connection electrode 3175, the fourth connection electrode 3176, the fifth connection electrode 4175, the sixth connection electrode 5175, the seventh connection electrode 6175, the eighth connection electrode 6176, and the ninth connection electrode 7175 may be positioned within a pixel circuit region PCR. The pixel circuit region PCR may be formed to have an approximately quadrangular shape. However, the shape of the pixel circuit region PCR is not limited thereto, and may be variously changed or modified. Pixel circuit regions PCR of two adjacent pixels are distinguished or separated from each other and do not overlap each other. In such an embodiment, the pixel circuit region PCR of a left pixel and the pixel circuit region PCR of a right pixel do not overlap each other.

In an embodiment, an opening 1165 is defined or formed through the first interlayer insulating layer 161, and a plurality of pixel circuit regions PCR may be divided by the opening 1165. In such an embodiment, the opening 1165 may be positioned between the plurality of pixel circuit regions PCR, and may be formed to surround an edge of the pixel circuit region PCR. The opening 1165 may be formed not only in the first interlayer insulating layer 161, but also in the first gate insulating layer 141 and the second gate insulating layer 142. However, the invention is not limited thereto, and the opening 1165 is formed in the first interlayer insulating layer 161 and the second gate insulating layer 142, and may not be formed in the first gate insulating layer 141. In an embodiment, the opening 1165 may be formed in the first interlayer insulating layer 161, the second gate insulating layer 142, the first gate insulating layer 141, and the buffer layer 111. Semiconductor layers, first gate conductors, second gate conductors, and third gate conductors positioned in different pixel circuit regions PCR are not directly connected to each other, but are spaced apart from each other.

Figure 8A:
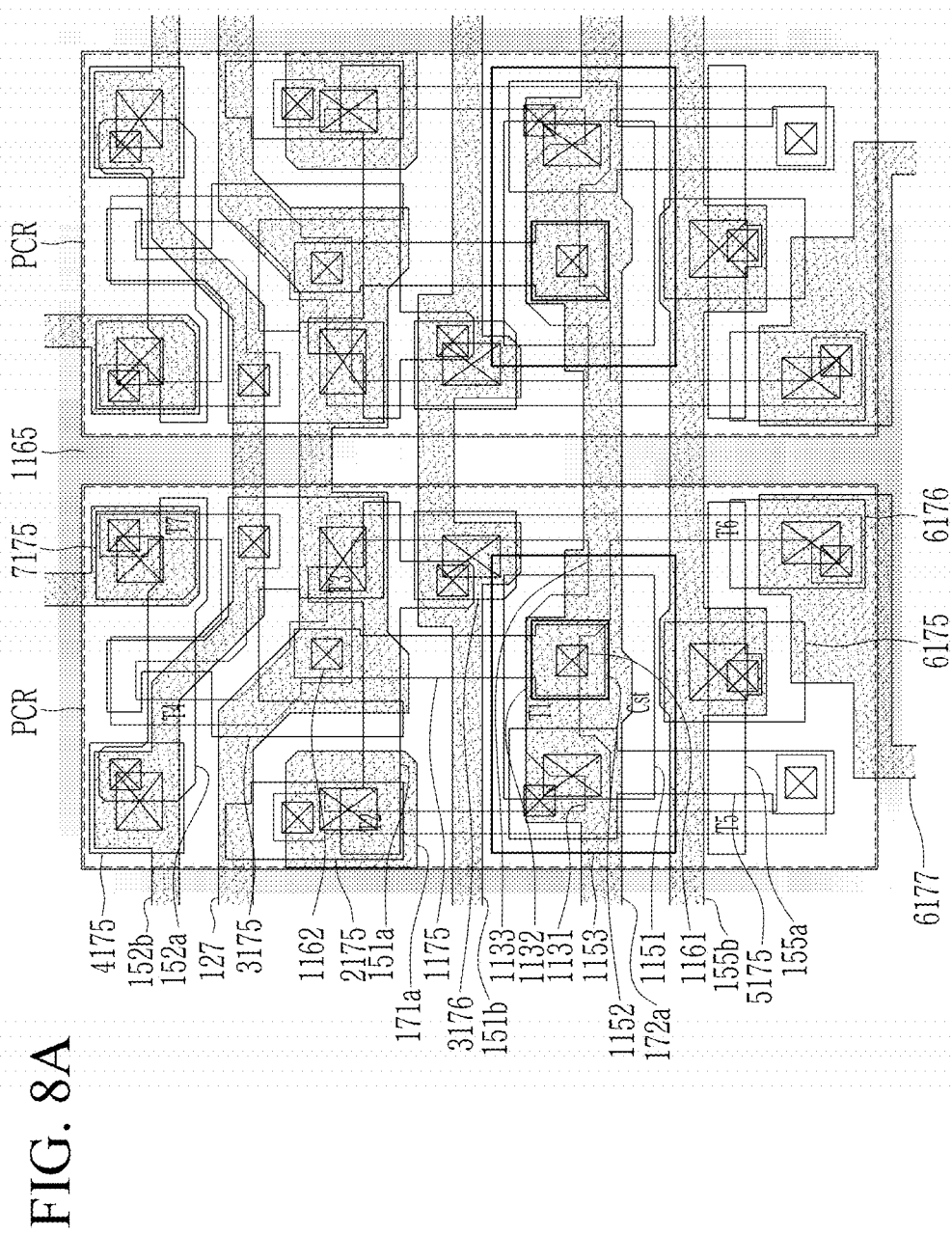
Figure 8B:
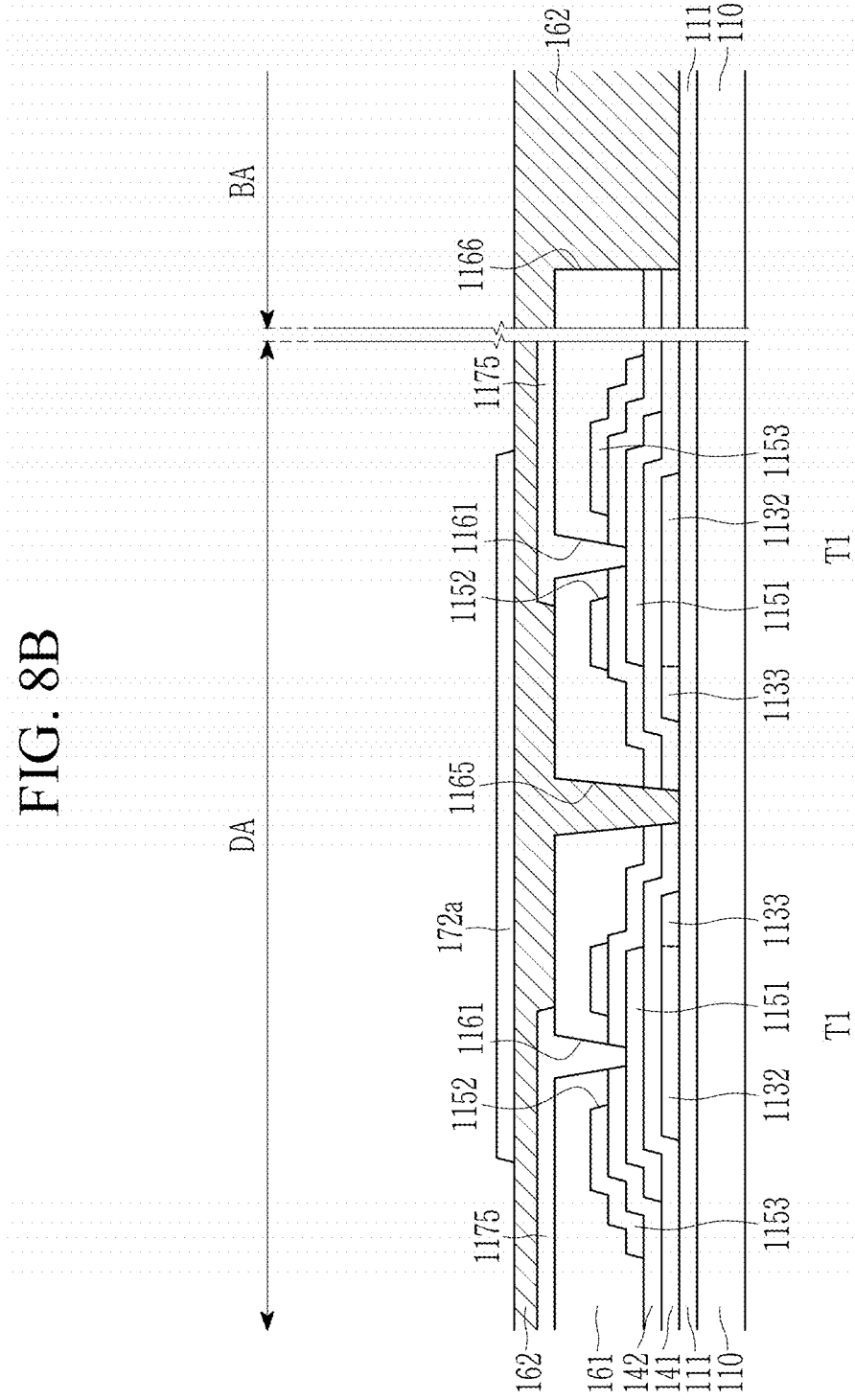

In an embodiment, as shown in FIG. 3B and FIG. 8B, a second interlayer insulating layer 162 may be disposed on the third gate conductor including the first connection electrode 1175. The second interlayer insulating layer 162 may have a single or multi-layered structure. The second interlayer insulating layer 162 may include at least one selected from a general purpose polymer such as poly(methyl methacrylate) ("PMMA") or polystyrene ("PS"), a polymer derivative having a phenolic group, an organic insulating material such as an acrylic polymer, an imide polymer, a polyimide, an acrylic polymer, a siloxane polymer, etc.

The second interlayer insulating layer 162 may be formed to fill the opening 1165. The pixel circuit regions PCR may be divided by the second interlayer insulating layer 162. In such an embodiment, the second interlayer insulating layer 162 may be positioned between the plurality of pixel circuit regions PCR, and may be formed to surround an edge of the pixel circuit region PCR. Each pixel may be formed to have an island shape by forming the opening 1165 in the second gate insulating layer 142, the first gate insulating layer 141, and the first interlayer insulating layer 161 including or made of an inorganic material and positioning the second interlayer insulating layer 162 including or made of an organic material within the opening 1165. Accordingly, even when an impact is applied from the outside and damage to the first interlayer insulating layer 161, etc. occurs, the pixel circuit region PCR has an independent structure by the second interlayer insulating layer 162 made of an organic material, and thus the impact applied to a pixel may be effectively prevented from affecting other adjacent pixels. In such an embodiment, cracks generated in any one region may be effectively prevented from propagating in the horizontal direction.

An opening 1166 may be defined or formed in a portion of the first interlayer insulating layer 161 in the bending area BA. The opening 1166 may be formed not only in the first interlayer insulating layer 161, but also in the first gate insulating layer 141 and the second gate insulating layer 142. The second interlayer insulating layer 162 may be formed to fill the opening 1166. The bending area BA may have a structure that is desirable for bending by removing the second gate insulating layer 142, the first gate insulating layer 141, and the first interlayer insulating layer 161 made of an inorganic material, which are positioned in the bending area BA as an area where the substrate 110 is bendable, and forming the second interlayer insulating layer including or made of an organic material instead thereof.

A first data conductor including an upper first scan line 151*b*, an upper second scan line 152*b*, an upper emission control line 155*b*, and an initialization voltage line 127 may be disposed or positioned on the second interlayer insulating layer 162. FIG. 8A and FIG. 8B illustrate a semiconductor layer, a first gate conductor, a second gate conductor, a third gate conductor, and a first data conductor together. The first data conductor may have a single or multi-layered structure. The first data conductor may include at least one selected from aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), copper (Cu), and the like, and may be a single layer or multiple layers.

In an embodiment, as shown in FIG. 8A, the upper first scan line 151*b* may overlap at least a portion of the lower first scan line 151*a*, and may be connected to the lower first scan line 151*a*. The upper first scan line 151*b* and the lower first scan line 151*a* may be connected by the fourth connection electrode 3176. The upper first scan line 151*b* constitutes the first scan line 151 together with the lower first scan line 151*a*. The upper first scan line 151*b* may extend substantially in a row direction, and may extend from a first end of the substrate 110 to a second end of the substrate 110. The lower first scan line 151*a* of pixels that are adjacent in the row direction may be connected to the same upper first scan line 151*b*. The scan signal GW applied to the upper first scan line 151*b* may be applied to the gate electrode of the second transistor T2 and the gate electrode of the third transistor T3 through the lower first scan line 151*a*.

The upper second scan line 152*b* may overlap at least a portion of the lower second scan line 152*a*, and may be connected to the lower second scan line 152*a*. The upper second scan line 152*b* and the lower second scan line 152*a* may be connected by the fifth connection electrode 4175. The upper second scan line 152*b* constitutes the second scan line 152 together with the lower second scan line 152*a*. The upper second scan line 152*b* may extend substantially in the row direction, and may extend from a first end of the substrate 110 to a second end of the substrate 110. The lower second scan line 152*a* of pixels that are adjacent in the row direction may be connected to a same upper second scan line 152*b*. The scan signal GI applied to the upper second scan line 152*b* may be applied to the gate electrode of the fourth transistor T4 through the lower second scan line 152*a*.

The upper emission control line 155*b* may overlap at least a portion of the lower emission control line 155*a*, and may be connected to the lower emission control line 155*a*. The upper emission control line 155*b* and the lower emission control line 155*a* may be connected by the seventh connection electrode 6175. The upper emission control line 155*b* constitutes the emission control line 155 together with a lower emission control line 155*a*. The upper emission control line 155*b* may extend substantially in the row direction, and may extend from a first end of the substrate 110 to a second end of the substrate 110. The lower emission control line 155*a* of pixels that are adjacent in the row direction may be connected to the same upper emission control line 155*b*. The emission control signal EM applied to the upper emission control line 155*b* may be applied to the gate electrode of the fifth transistor T5 and the gate electrode of the sixth transistor T5 through the lower emission control line 155*a*.

The initialization voltage line 127 may extend substantially in the row direction, and may extend from the first end of the substrate 110 to the second end of the substrate 110. Pixels that are adjacent in the row direction may be connected to the same initialization voltage line 127. The initialization voltage Vint applied to the initialization voltage line 127 may be applied to the first region of the fourth transistor T4 of the fourth transistor T4 and the second region of the seventh transistor T7 through the third connection electrode 3175.

The first data conductor may further include a data line connection electrode 171*a*, an auxiliary driving voltage line 172*a*, and a tenth connection electrode 6177.

The data line connection electrode 171*a* may overlap and may be connected to the second connection electrode 2175. The data line connection electrode 171*a* may be connected to the first region of the second transistor T2 through the second connection electrode 2175.

The auxiliary driving voltage line 172*a* may overlap and may be connected to the sixth connecting electrode 5175. The auxiliary driving voltage line 172*a* may extend substantially in the row direction, and may extend from the first end of the substrate 110 to the second end of the substrate 110. Pixels that are adjacent in the row direction may be connected to a same auxiliary driving voltage line 172*a*.

The tenth connection electrode 6177 may overlap and may be connected to the seventh connection electrode 6175 and the ninth connection electrode 7175. The tenth connection electrode 6177 may be connected to the second region of the sixth transistor T6 through the seventh connection electrode 6175. The tenth connection electrode 6177 may be connected to the first region of the seventh transistor T7 through the ninth connection electrode 7175. Accordingly, the tenth connection electrode 6177 may connect the sixth transistor and the seventh transistor.

Figure 9A:
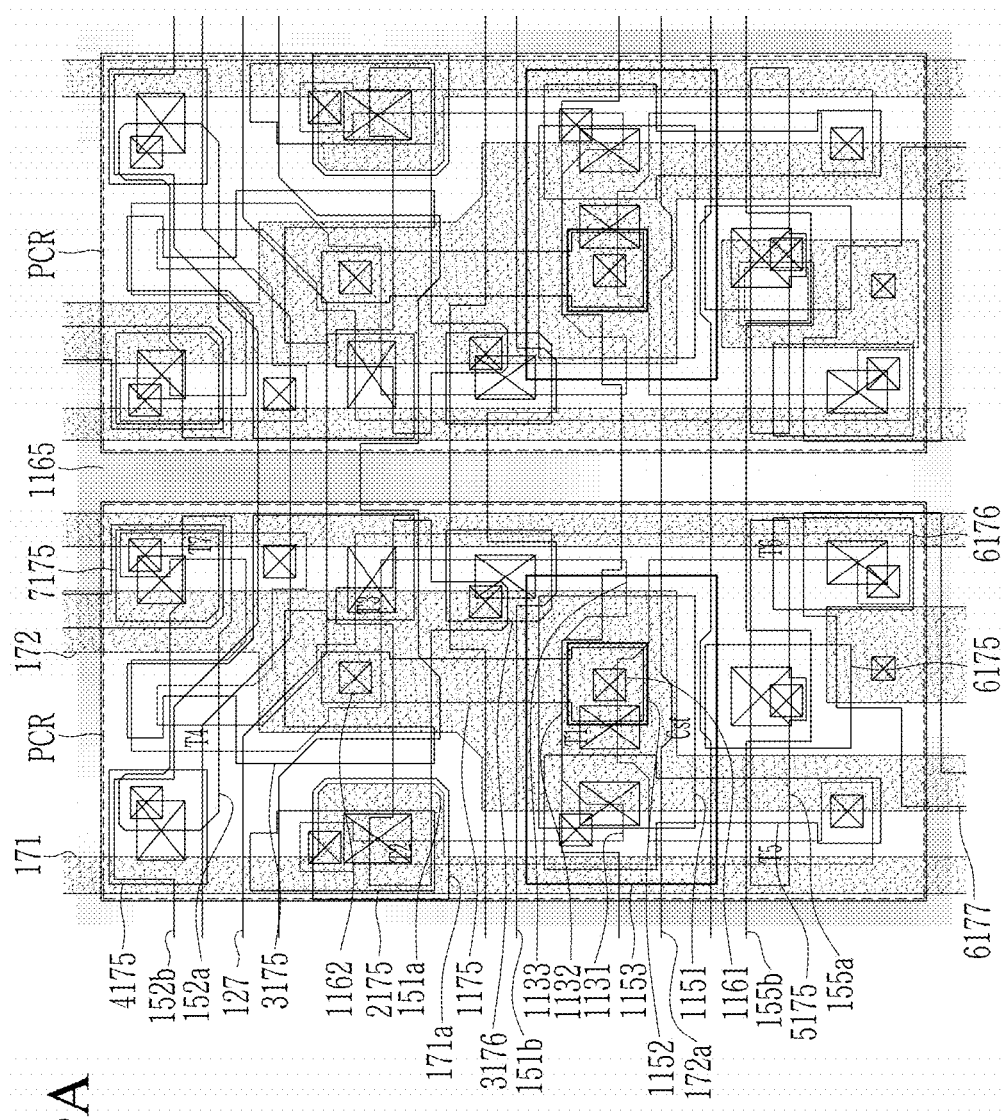
Figure 9B:
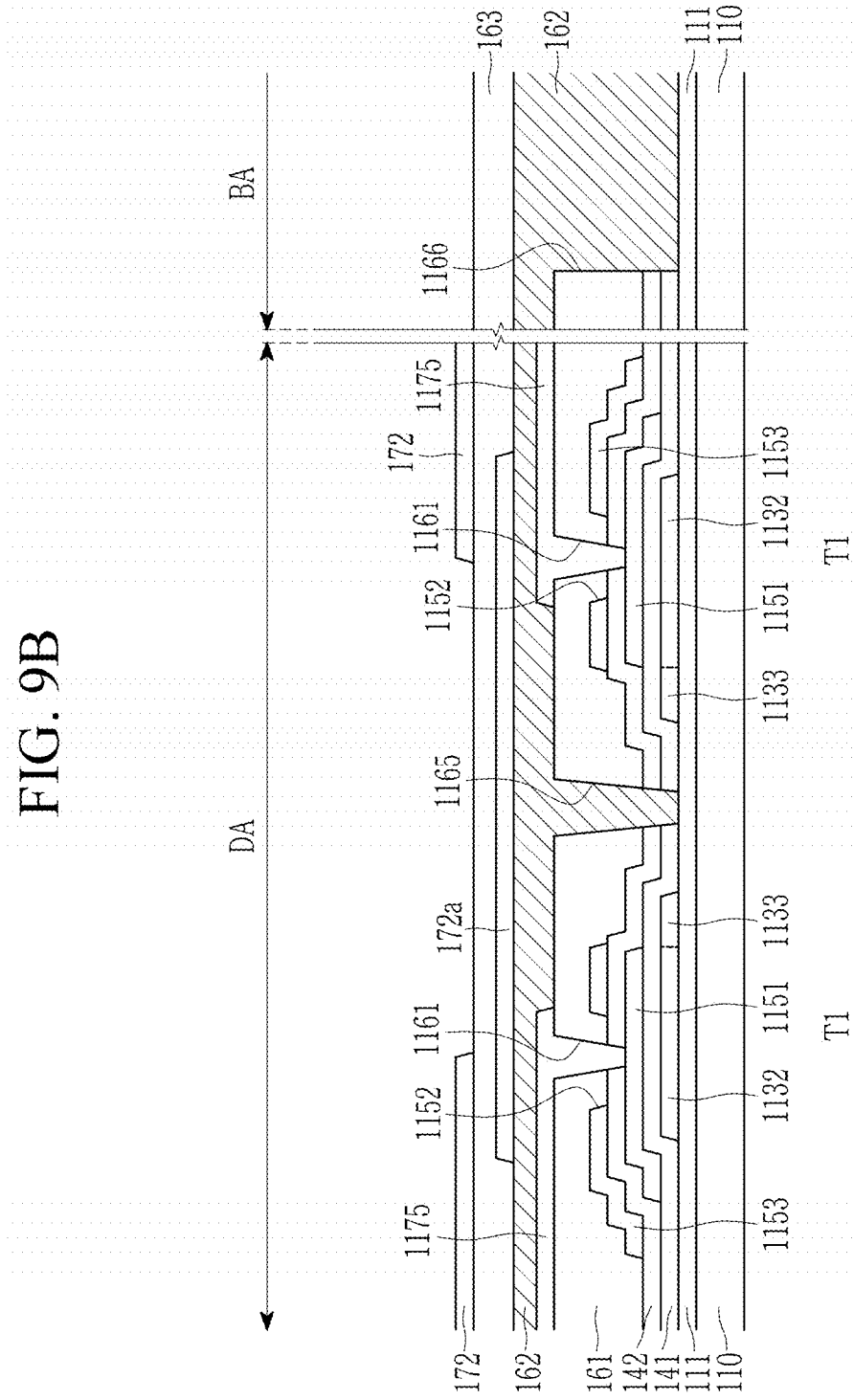

In an embodiment, as shown in FIG. 3B and FIG. 9B, a third interlayer insulating layer 163 may be disposed on the first data conductor including the upper first scan line 151*b*, the upper second scan line 152*b*, the upper emission control line 155*b*, and the initialization voltage line 127. The third interlayer insulating layer 163 may include at least one selected from a general purpose polymer such as PMMA or PS, a polymer derivative having a phenolic group, an organic insulating material such as an acrylic polymer, an imide polymer, a polyimide, an acrylic polymer, a siloxane polymer, etc.

In such an embodiment, a second data conductor including the data line 171 and the driving voltage line 172 may be disposed on the third interlayer insulating layer 163. FIG. 9A and FIG. 9B illustrate a semiconductor layer, a first gate conductor, a second gate conductor, a third gate conductor, a first data conductor, and a second data conductor together. The second data conductor may have a single or multi-layered structure. The second data conductor may include at least one selected from aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and copper (Cu), etc.

The data line 171 may overlap and may be connected to the data line connection electrode 171*a*. The data line 171 may be connected to the first region of the second transistor T2 through the data line connection electrode 171*a* and the second connection electrode 2175. The data line 171 may extend substantially in the column direction, and may extend from the first end of the substrate 110 to the second end of the substrate 110. Pixels that are adjacent in the column direction may be connected to a same data line 171.

The driving voltage line 172 may cross and overlap and may be connected to the auxiliary driving voltage line 172*a*. The driving voltage line 172 may be connected to the first region of the first storage electrode 1153 and the fifth transistor T5 through the auxiliary driving voltage line 172*a* and the sixth connection electrode 5175. The driving voltage line 172 may extend substantially in the column direction, and may extend from the first end of the substrate 110 to the second end of the substrate 110. Pixels that are adjacent in the column direction may be connected to a same driving voltage line 172.

In an embodiment, as shown in FIG. 3B, a passivation layer 180 may be disposed on the data line 171 and the driving voltage line 172, and an anode 191 may be disposed on the passivation layer 180. The passivation layer 180 may include at least one selected from a general purpose polymer such as PMMA or PS, a polymer derivative having a phenolic group, an organic insulating material such as an acrylic polymer, an imide polymer, a polyimide, an acrylic polymer, a siloxane polymer, etc. The anode 191 may be connected to the sixth transistor T6, and may receive an output current of the first transistor T1. In such an embodiment, a partition wall 350 may be disposed on the anode 191. A pixel opening 351 may be defined or formed in the partition wall 350, and the pixel opening 351 of the partition wall 350 may overlap the anode 191. A light emitting diode layer 370 may be disposed in the pixel opening 351 of the partition wall 350. The light emitting diode layer 370 may overlap the anode 191. A spacer 360 may be disposed on the partition wall 350. The spacer 360 may be positioned at a boundary between adjacent pixel circuit regions PCR. A cathode 270 may be disposed on the light emitting diode layer 370, the partition wall 350, and the spacer 360. The anode 191, the light emitting diode layer 370, and the cathode 270 may collectively constitute a light emitting diode LED.

Hereinafter, a multi-layered structure of the first interlayer insulating layer 161 of the display device according to an embodiment will be described in greater with reference to FIG. 10 to FIG. 12.

Figure 10:
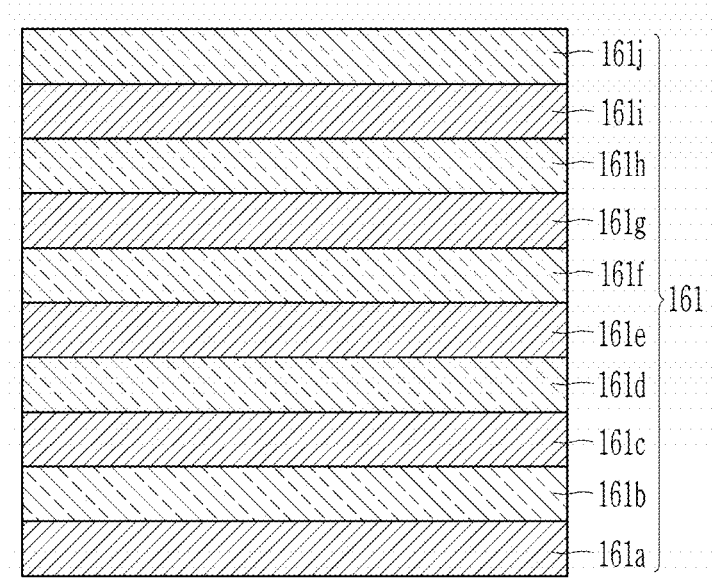
FIG. 10 to FIG. 12 illustrate cross-sectional views showing a first interlayer insulating layer of a display device according to various embodiments.
Figure 11:
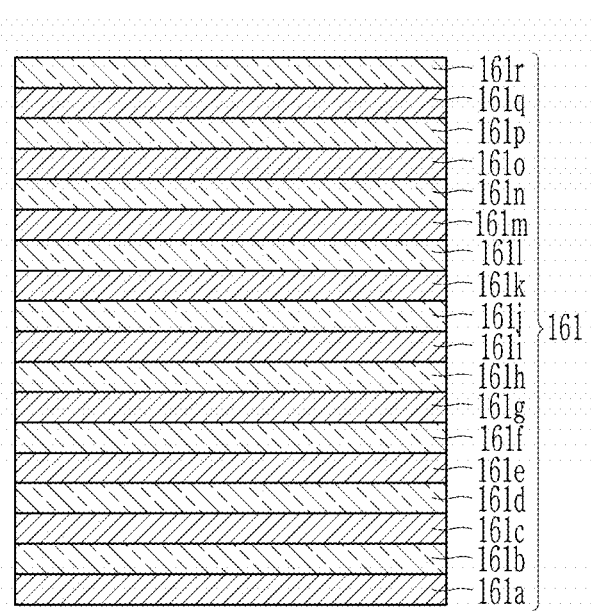
Figure 12:
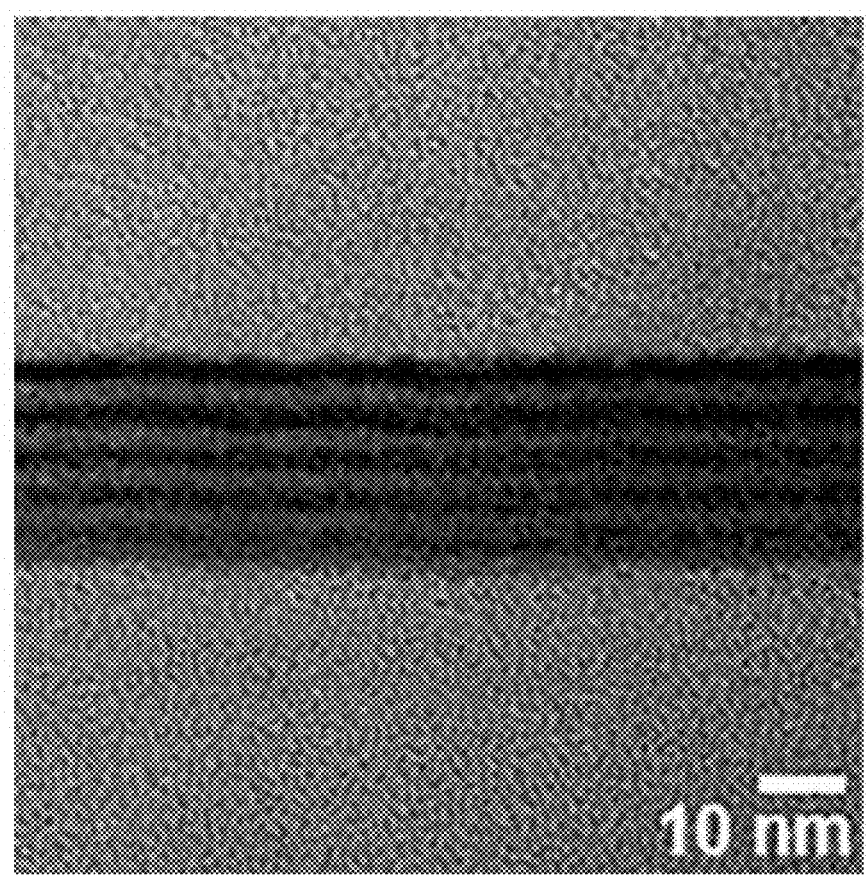

FIG. 10 to FIG. 12 illustrate cross-sectional views showing a first interlayer insulating layer of a display device according to various embodiments.

As illustrated in FIG. 10, an embodiment of the first interlayer insulating layer 161 of the display device may be formed to have a multilayer structure including a plurality of layers. In one embodiment, for example, the first interlayer insulating layer 161 may include a first layer 161a, a second layer 161b, a third layer 161c, a fourth layer 161d, a fifth layer 161e, a sixth layer 161f, a seventh layer 161g, an eighth layer 161h, a ninth layer 161i, and a tenth layer 161j, which are sequentially stacked one on another. In such an embodiment, the first interlayer insulating layer 161 may be formed by alternately stacking different materials one on another.

In one embodiment, for example, the first layer 161a, the third layer 161c, the fifth layer 161e, the seventh layer 161g, and the ninth layer 161i may include or be made of a silicon oxide ($SiO_x$), and the second layer 161b, the fourth layer 161d, the sixth layer 161f, the eighth layer 161h, and the tenth layer 161j may include or be made of a silicon nitride ($SiN_x$). In an embodiment, a layer made of a silicon oxide and a layer made of a silicon nitride may be continuously alternately deposited in an in-situ manner using a chemical vapor deposition ("CVD") method in a same chamber.

Thicknesses of the first layer 161a, the second layer 161b, the third layer 161c, the fourth layer 161d, the fifth layer 161e, the sixth layer 161f, the seventh layer 161g, the eighth layer 161h, the ninth layer 161i, and the tenth layer 161j of the first interlayer insulating layer 161 may be the same as or different from each other. In one embodiment, for example, the thickness of the first layer 161a may be about 1400 angstrom (Å), and each of the thicknesses of the second layer 161b, the fourth layer 161d, the sixth layer 161f, and the eighth layer 161h may be about 250 Å. In such an embodiment, each of the thicknesses of the third layer 161c, the fifth layer 161e, the seventh layer 161g, and the ninth layer 161i may be about 400 Å, and the thickness of the tenth layer 161j may be about 1000 Å.

In one alternative embodiment, for example, each of the first layer 161a, the third layer 161c, the fifth layer 161e, the seventh layer 161g, and the ninth layer 161i has a thickness of about 600 Å, and each of the second layer 161b, the fourth layer 161d, the sixth layer 161f, the eighth layer 161h, and the tenth layer 161j may have a thickness of about 400 Å. In one alternative embodiment, for example, the thickness of the first layer 161a may be about 1000 Å, and each of the thicknesses of the second layer 161b, the fourth layer 161d, the sixth layer 161f, and the eighth layer 161h may be about 300 Å. In this case, each of the thicknesses of the third layer 161c, the fifth layer 161e, the seventh layer 161g, and the ninth layer 161i may be about 500 Å, and the thickness of the tenth layer 161j may be about 800 Å.

In an embodiment, as shown in FIG. 10, the first interlayer insulating layer 161 includes 10 layers, but the invention is not limited thereto, and a number of layers constituting the first interlayer insulating layer 161 may be variously changed. In one alternative embodiment, for example, as illustrated in FIG. 11, the first interlayer insulating layer 161 may include 18 layers.

In such an embodiment, as illustrated in FIG. 11, the first interlayer insulating layer 161 may include a first layer 161a, a second layer 161b, a third layer 161c, a fourth layer 161d, a fifth layer 161e, a sixth layer 161f, a seventh layer 161g, an eighth layer 161h, a ninth layer 161i, a tenth layer 161j, an eleventh layer 161k, a twelfth layer 161l, a thirteenth layer 161m, a fourteenth layer 161n, a fifteenth layer 161o, a sixteenth layer 161p, a seventeenth layer 161q, and an eighteenth layer 161r, which are sequentially stacked one on another. In such an embodiment, the first interlayer insulating layer 161 may be formed by alternately stacking different materials one on another.

In one embodiment, for example, the first layer 161a, the third layer 161c, the fifth layer 161e, the seventh layer 161g, the ninth layer 161i, the eleventh layer 161k, the thirteenth layer 161m, the fifteenth layer 161o, and the seventh layer 161q may include or be made of a silicon oxide ($SiO_x$), and the second layer 161b, the fourth layer 161d, the sixth layer 161f, the eighth layer 161h, the tenth layer 161j, the twelfth layer 161l, the fourteenth layer 161n, the sixteenth layer 161p, and the eighteenth layer 161r may include or be made of a silicon nitride ($SiN_x$).

Thicknesses of the first layer 161a, the second layer 161b, the third layer 161c, the fourth layer 161d, the fifth layer 161e, the sixth layer 161f, the seventh layer 161g, the eighth layer 161h, the ninth layer 161i, the tenth layer 161j, the eleventh layer 161k, a twelfth layer 161l, a thirteenth layer 161m, the fourteenth layer 161n, the fifteenth layer 161o, the sixteenth layer 161p, the seventeenth layer 161q, and the eighteenth layer 161r of the first interlayer insulating layer 161 may be the same as or different from each other. In one embodiment, for example, the thickness of the first layer 161a may be about 1400 Å, and each of the thicknesses of the second layer 161b, the fourth layer 161d, the sixth layer 161f, the eighth layer 161h, the tenth layer 161j, the twelfth layer 161l, the fourteenth layer 161n, and the sixteenth layer 161p may be about 125 Å. In such an embodiment, each of the thicknesses of the third layer 161c, the fifth layer 161e, the seventh layer 161g, the ninth layer 161i, the eleventh layer 161k, the thirteenth layer 161m, the fifteenth layer 161o, and the seventeenth layer 161q may be about 200 Å, and the thickness of the eighteenth layer 161r may be about 1000 Å.

In an embodiment, as described above, the layers constituting the first interlayer insulating layer 161 may be formed by alternately stacking a layer including or made of a silicon oxide ($SiO_x$) and a layer including or made of a silicon nitride ($SiN_x$), but the invention is not limited thereto. A material of the layers constituting the first interlayer insulating layer 161 may include inorganic insulating materials of different components. In an embodiment, the first interlayer insulating layer 161 may be formed in a form in which three or more materials are repeatedly stacked.

In an embodiment, the first interlayer insulating layer 161 may include a same material as each other, but may be formed by alternately stacking a plurality of layers having different characteristics from each other. Even for a layer including a same material, layers having different characteristics may be formed by changing film formation conditions. In an embodiment, layers having different deposition conditions such as a temperature, a flow rate of gas used, an interval between electrodes, power, pressure, etc. may have different moduli of elasticity. In one embodiment, for example, as shown in Table 1, inorganic insulating layers formed by varying a flow rate of silane may have different characteristics from each other.

TABLE 1

| Components of inorganic insulating layer | Silane flow rate (sccm) | Modulus of elasticity (GPa) | Hardness (GPa) | Poisson's ratio |
|---|---|---|---|---|
| $SiN_x$ | 16 | 153.0 ± 14.9 | 13.6 ± 2.9 | 0.27 |
| | 32 | 117.8 ± 9.5 | 11.8 ± 1.8 | |
| | 50 | 108.5 ± 10.6 | 10.2 ± 3.0 | |
| $SiO_xN_y$ | 20 | 89.2 ± 4.8 | 4.7 ± 0.7 | 0.23 |
| | 30 | 78.9 ± 12.6 | 7.8 ± 0.9 | |
| | 50 | 76.8 ± 9.6 | 9.7 ± 4.0 | |

In embodiments, as described above, the thickness of each of the layers constituting the first interlayer insulating layer 161 may be variously changed. In such embodiments, a total thickness of the first interlayer insulating layer 161 may be constant or predetermined. The thickness of the first interlayer insulating layer 161 may be greater than or equal to about 4500 Å and less than or equal to about 5500 Å. The number and thickness of the layers constituting the first interlayer insulating layer 161 may be variously set within a range of about 4500 Å to about 5500 Å or less of the thickness of the first interlayer insulating layer 161. As shown in FIG. 12, a first interlayer insulating layer 161 having a structure in which a plurality of layers having different characteristics are alternately stacked one on another may be formed. FIG. 12 illustrates an embodiment in which the first interlayer insulating layer 161 including ten layers is actually formed by repeatedly stacking two layers having different characteristics from each other.

Hereinafter, characteristics when the first interlayer insulating layer 161 of the display device according to an embodiment is formed as a multi-layered thin layer will be described with reference to FIG. 13 and FIG. 14.

Figure 13:
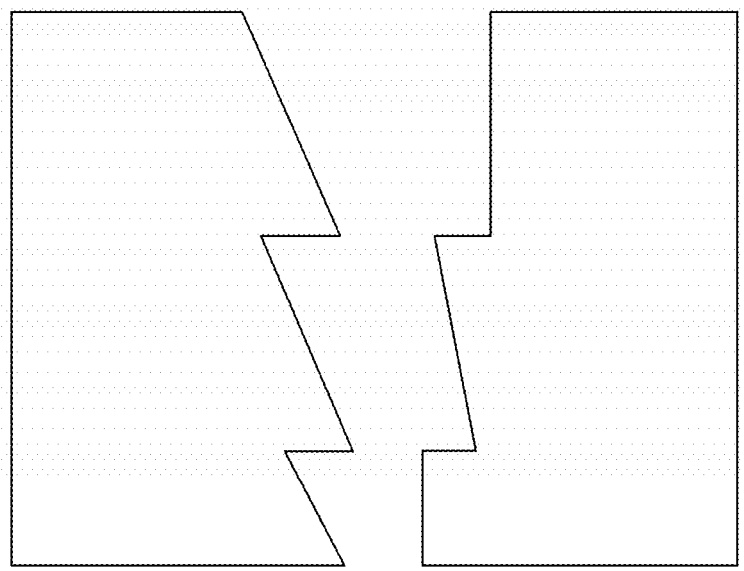
FIG. 13 illustrates a schematic diagram showing a case in which an impact is applied to an insulating layer made of a single layer.
Figure 14:
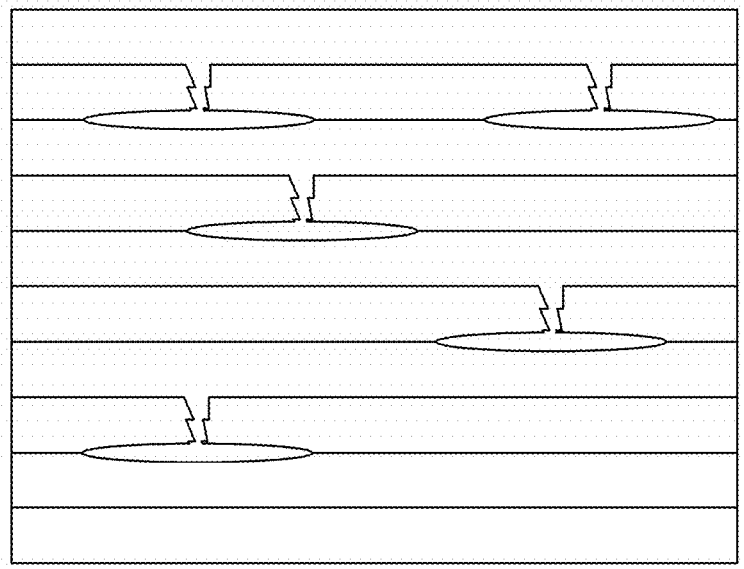
FIG. 14 illustrates a schematic diagram showing a case in which an impact is applied to an insulating layer made of a multi-layered thin layer.

FIG. 13 illustrates a schematic diagram showing a case in which an impact is applied to an insulating layer made of a single layer (or having a single layer structure), and FIG. 14 illustrates a schematic diagram showing a case in which an impact is applied to an insulating layer made of a multi-layered thin layer (or having a multilayer structure). A total thickness of insulating layers shown in FIG. 13 and FIG. 14 may be similar to each other.

As illustrated in FIG. 13, when an impact is applied to an upper surface of the insulating layer made of a single layer, the impact may be directly transferred to a lower surface of the insulating layer. In this case, damage corresponding to the total thickness of the insulating layer may occur, and the impact may be transferred to other adjacent layers. When the insulating layer is damaged, conductors separated by the insulating layer may be short-circuited to each other, and accordingly, a corresponding pixel may not be properly driven.

As illustrated in FIG. 14, when an impact is applied to the insulating layer made of a multi-layered thin layer, the impact may not be directly transferred to the lower surface of the insulating layer. Damage may occur to some of a plurality of layers constituting the insulating layer, but an impact may not be transferred to other layers that are adjacent to the damaged layer, and damage may not occur thereto. Accordingly the impact may be effectively prevented from being transferred to other layers that are adjacent to the insulating layer.

In an embodiment, the first interlayer insulating layer 161 of the display device may include a plurality of layers having different characteristics from each other. In such an embodiment, a plurality of layers may include about 10 or more layers, and may have a structure in which two or more layers having different characteristics from each other are repeatedly stacked. In an embodiment of the first interlayer insulating layer 161 having such a structure, even if an impact is applied from the outside and damage to the first interlayer insulating layer 161 occurs, the damage to the first interlayer insulating layer 161 may be effectively prevented from affecting other adjacent layers by the first interlayer insulating layer 161 made of a multi-layered thin layer. In such an embodiment, cracks generated in any one region of the first interlayer insulating layer 161 may be effectively prevented from propagating in the vertical direction.

A characteristic of a display device according to an embodiment will now be described with reference to FIG. 15 to FIG. 18.

Figure 15:
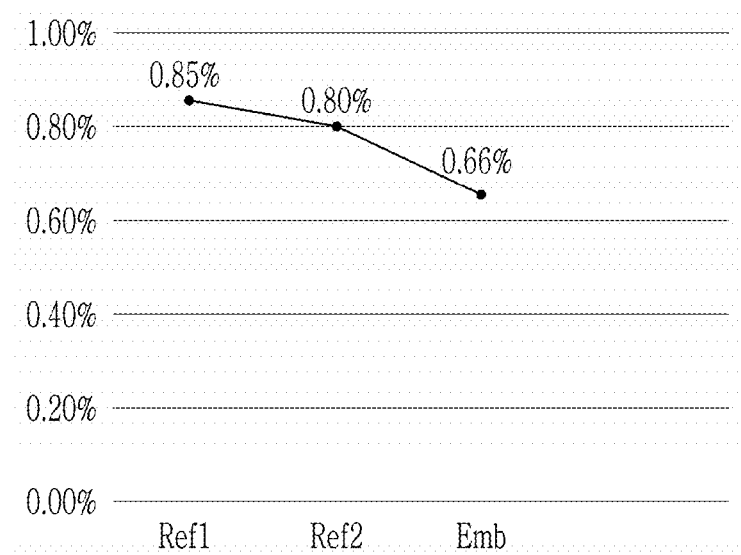
FIG. 15 illustrates a graph showing strains of a display device according to an embodiment of the invention and a display device according to a reference example.
Figure 16:
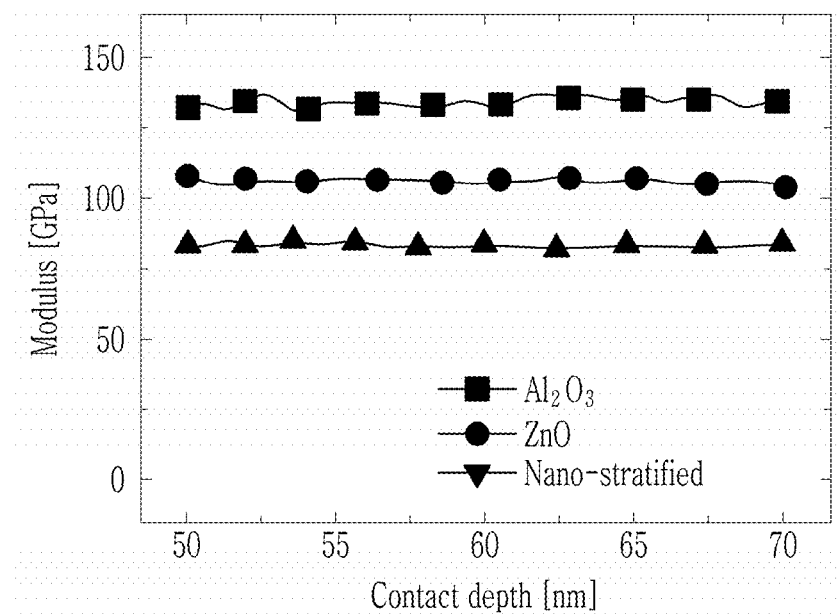
FIG. 16 illustrates a graph showing modulus of elasticity of an insulating layer when it is made of a single layer and when it is made of multiple layers.
Figure 17:
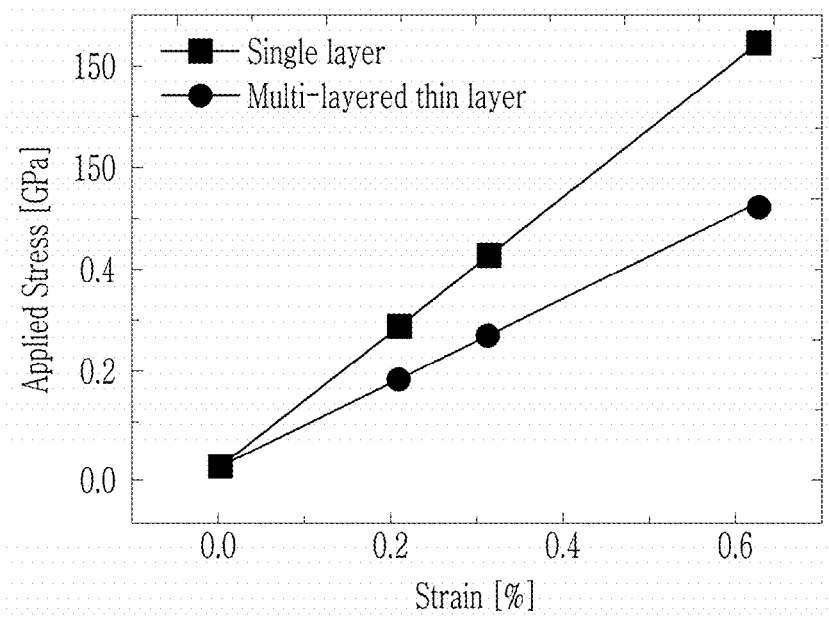
FIG. 17 illustrates a graph showing stress of an insulating layer when it is made of a single layer and when it is made of multiple layers.
Figure 18:
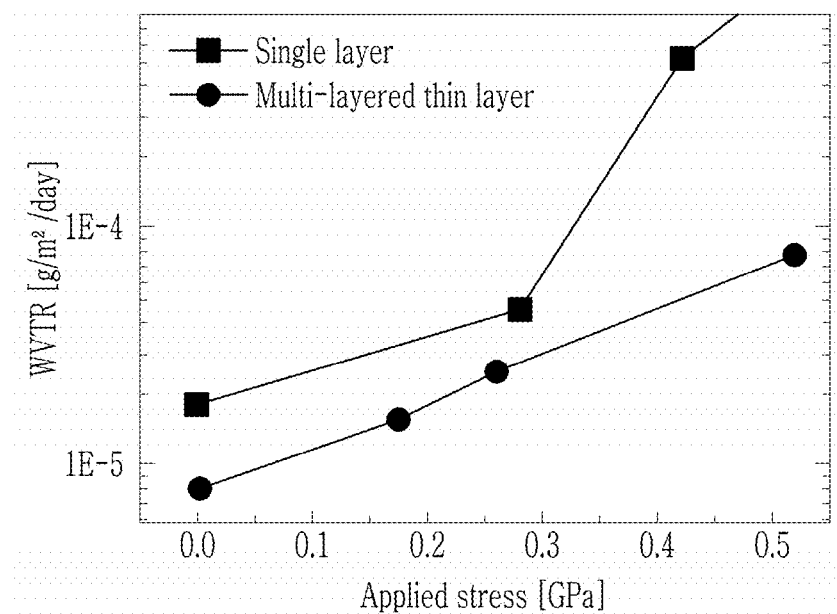
FIG. 18 illustrates a graph showing moisture permeability of an insulating layer when it is made of a single layer and when it is made of multiple layers.

FIG. 15 illustrates a graph showing strains of a display device according to an embodiment of the invention and a display device according to a reference example, FIG. 16 illustrates a graph showing modulus of elasticity of an insulating layer when it is made of a single layer and when it is made of multiple layers, FIG. 17 illustrates a graph showing stress of an insulating layer when it is made of a single layer and when it is made of multiple layers, and FIG. 18 illustrates a graph showing moisture permeability of an insulating layer when it is made of a single layer and when it is made of multiple layers.

As illustrated in FIG. 15, the strain of the display device according to an embodiment of the invention (Emb) may be lower than that of the display device according to Reference Example 1 (Ref1) and Reference Example 2 (Ref2).

In the display device according to the embodiment of the invention Emb, the opening 1165 is formed in the first interlayer insulating layer 161 to separate the pixel circuit regions PCR, and the second interlayer insulating layer 162 made of an organic material is formed to fill the opening 1165. In such an embodiment, the first interlayer insulating layer 161 has a structure including a plurality of layers.

In the case of the display device according to Reference Example 1 (Ref1), an opening for dividing the pixel circuit regions PCR is not formed, and the first interlayer insulating layer 161 is formed as a single layer.

In the case of the display device according to Reference Example 2 (Ref2), the opening 1165 is formed in the first interlayer insulating layer 161 to separate the pixel circuit regions PCR, and the second interlayer insulating layer 162 made of an organic material is formed to fill the opening 1165. The first interlayer insulating layer 161 is formed as a single layer.

As shown in FIG. 15, the display device according to Reference Example 2 (Ref2) has a lower strain compared to the display device according to Reference Example 1 (Ref1). This is because in Reference Example 2 (Ref2), since the pixel circuit regions PCR are divided by the second interlayer insulating layer 162, crack propagation in the horizontal direction may be prevented.

In the display device according to the embodiment of the invention (Emb), since the first interlayer insulating film 161 has a structure including a plurality of layers, not only crack propagation in the horizontal direction but also crack propagation in the vertical direction may be prevented, thereby further reducing the strain.

As illustrated in FIG. 16, modulus of elasticity decreases in a case (Nano-stratified) including a plurality of layers as compared to a case where the insulating layer is made of a single layer of aluminum oxide ($Al_2O_3$) or a single layer of zinc oxide (ZnO).

In the display device according to the embodiment of the invention, since the first interlayer insulating layer 161 has a structure including a plurality of layers having different characteristics from each other, the modulus of elasticity may be reduced, and thus strain may be reduced. Accordingly, the first interlayer insulating layer 161 in the display device according to the embodiment of the invention has a more robust characteristic than that of the reference example.

As illustrated in FIG. 17, a stress applied to the insulating layer is decreased when the insulating layer includes a plurality of layers compared to the case where the insulating layer is formed as a single layer.

In the display device according to the embodiment of the invention, since the first interlayer insulating layer 161 has a structure including a plurality of layers having different characteristics, a stress value acting on the first interlayer insulating layer 161 may be reduced. Accordingly, the first interlayer insulating layer 161 in the display device according to the embodiment of the invention has a more robust characteristic than that of the reference example.

As illustrated in FIG. 18, moisture permeability of the insulating layer is decreased when the insulating layer includes a plurality of layers compared to the case where the insulating layer is formed as a single layer.

In the display device according to the embodiment of the invention, since the first interlayer insulating layer 161 has a structure including a plurality of layers having different characteristics, the moisture permeability of the first interlayer insulating layer 161 may be reduced. Accordingly, the first interlayer insulating layer 161 in the display device according to the embodiment of the invention has a more robust characteristic than that of the reference example.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a substrate;
a semiconductor disposed on the substrate;
a first gate insulating layer disposed on the semiconductor;
a gate electrode disposed on the first gate insulating layer;
a second gate insulating layer disposed on the gate electrode;
a first storage electrode disposed on the second gate insulating layer;
a first interlayer insulating layer disposed on the first storage electrode, wherein an opening is defined through the first interlayer insulating layer to surround the semiconductor, the gate electrode, and the first storage electrode; and
a second interlayer insulating layer disposed on the first interlayer insulating layer and disposed in the opening, wherein the second interlayer insulating layer covers the semiconductor, the gate electrode, and the first storage electrode,
wherein the second interlayer insulating layer includes an organic material.

2. The display device of claim 1, wherein
the first interlayer insulating layer includes a plurality of layers having different characteristics from each other.

3. The display device of claim 2, wherein
a layer including a first material and a layer including a second material are alternately and repeatedly stacked one on another in the first interlayer insulating layer.

4. The display device of claim 3, wherein
the first material is a silicon oxide, and
the second material is a silicon nitride.

5. The display device of claim 2, wherein
the first interlayer insulating layer includes 10 or more layers.

6. The display device of claim 2, wherein
the first interlayer insulating layer includes an inorganic material.

7. The display device of claim 2, wherein
a thickness of the first interlayer insulating layer is greater than or equal to about 4500 Å and less than or equal to about 5500 Å.

8. The display device of claim 1, wherein
the display device includes a plurality of pixel circuit regions, and
the semiconductor, the gate electrode, and the first storage electrode are positioned in the pixel circuit regions.

9. The display device of claim 8, wherein
the opening surrounds an edge of the pixel circuit regions, and
the pixel circuit regions are divided one from another by the opening.

10. The display device of claim 8, further comprising:
a plurality of transistors disposed on the substrate; and
a lower first scan line, a lower second scan line, and a lower emission control line, which are connected to at least one of the transistors,
wherein the transistors, the lower first scan line, the lower second scan line, and the lower emission control line are disposed in the pixel circuit regions.

11. The display device of claim 10, wherein
lower first scan lines disposed in different pixel circuit regions are spaced apart from each other,
lower second scan lines disposed in different pixel circuit regions are spaced apart from each other, and
lower emission control lines disposed in different pixel circuit regions are spaced apart from each other.

12. The display device of claim 11, further comprising
an upper first scan line, an upper second scan line and an upper emission control line, which are disposed on the second interlayer insulating layer,
wherein the upper first scan line is connected to the lower first scan lines disposed in the different pixel circuit regions,
the upper second scan line is connected to the lower second scan lines disposed in the different pixel circuit regions, and the upper emission control line is connected to the lower emission control lines disposed in the different pixel circuit regions.

13. The display device of claim 11, further comprising:
a third interlayer insulating layer disposed on the upper first scan line, the upper second scan line, and the upper emission control line;
a data line and a driving voltage line disposed on the third interlayer insulating layer to be connected to at least one of the transistors;
a passivation layer disposed on the data line and the driving voltage line;
an anode disposed on the passivation layer to be connected to at least one of the transistors;
a light emitting diode layer disposed on the anode; and
a cathode disposed on the light emitting diode layer.

14. The display device of claim 1, wherein
each of the first gate insulating layer and the second gate insulating layer includes an inorganic material, and
the opening is defined further through the first gate insulating layer and the second gate insulating layer.

15. A display device comprising:
a substrate;
a semiconductor disposed on the substrate;
a first gate insulating layer disposed on the semiconductor;
a gate electrode disposed on the first gate insulating layer;
a second gate insulating layer disposed on the gate electrode;
a first storage electrode disposed on the second gate insulating layer; and
a first interlayer insulating layer disposed on the first storage electrode;
a second interlayer insulating layer disposed on the first interlayer insulating layer,
wherein an opening is defined through the first gate insulating layer, the second gate insulating layer and the first interlayer insulating layer to surround the semiconductor, the gate electrode, and the first storage electrode,
the second interlayer insulating layer is disposed to fill the opening,
wherein a layer including a first material and a layer including a second material are alternately and repeatedly stacked one on another in the first interlayer insulating layer through which the opening filled with the second interlayer insulating layer is defined,
the first material and the second material have different characteristics from each other, and
the second interlayer insulating layer covers the semiconductor, the gate electrode, and the first storage electrode.

16. The display device of claim 15, wherein
the first material is a silicon oxide, and
the second material is a silicon nitride.

17. The display device of claim 16, wherein
the first interlayer insulating layer includes 10 or more layers.

18. The display device of claim 15, wherein
the first interlayer insulating layer includes an inorganic material, and
the second interlayer insulating layer includes an organic material.

19. The display device of claim 18, wherein
the display device includes a plurality of pixel circuit regions,
the semiconductor, the gate electrode, and the first storage electrode are disposed in the pixel circuit regions, and
the opening surrounds an edge of the pixel circuit regions, and
the pixel circuit regions are divided one from another by the opening.

20. The display device of claim 15, wherein
a thickness of the first interlayer insulating layer is greater than or equal to about 4500 Å and less than or equal to about 5500 Å.

* * * * *